(12) United States Patent
Lee et al.

(10) Patent No.: US 8,211,793 B2
(45) Date of Patent: Jul. 3, 2012

(54) STRUCTURES ELECTRICALLY CONNECTING ALUMINUM AND COPPER INTERCONNECTIONS AND METHODS OF FORMING THE SAME

(75) Inventors: Jong-Myeong Lee, Seongnam-si (KR); Sang-Woo Lee, Seoul (KR); Gil-Heyun Choi, Seoul (KR); Jong-Won Hong, Suwon-si (KR); Kyung-In Choi, Chuncheon-si (KR); Hyun-Bae Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/714,704

(22) Filed: Mar. 1, 2010

(65) Prior Publication Data
US 2010/0151674 A1    Jun. 17, 2010

Related U.S. Application Data

(63) Continuation of application No. 11/679,723, filed on Feb. 27, 2007, now abandoned.

(30) Foreign Application Priority Data

Aug. 18, 2006  (KR) .................. 10-2006-0078232

(51) Int. Cl.
*H01L 21/4763* (2006.01)
(52) U.S. Cl. ............. 438/637; 438/638; 257/E21.579
(58) Field of Classification Search .......... 438/618–639; 257/E21.579
See application file for complete search history.

(56) References Cited

U.S. PATENT DOCUMENTS

| | | | |
|---|---|---|---|
| 6,211,069 B1* | 4/2001 | Hu et al. ................ | 438/637 |
| 6,583,039 B2 | 6/2003 | Chen et al. | |
| 6,723,635 B1* | 4/2004 | Ngo et al. ............... | 438/627 |
| 6,727,169 B1 | 4/2004 | Raaijmakers et al. | |
| 6,818,992 B1 | 11/2004 | Armbrust et al. | |
| 7,335,590 B2* | 2/2008 | Suh et al. .............. | 438/643 |
| 2002/0048931 A1* | 4/2002 | Farrar ................... | 438/622 |
| 2002/0123219 A1* | 9/2002 | Laverty et al. .......... | 438/637 |
| 2004/0018722 A1* | 1/2004 | Tarumi et al. .......... | 438/638 |
| 2005/0082685 A1 | 4/2005 | Bojkov et al. | |

FOREIGN PATENT DOCUMENTS

JP        5-283407        10/1993
(Continued)

OTHER PUBLICATIONS

English Abstract for Publication No. 5-283407.
(Continued)

*Primary Examiner* — Brook Kebede
(74) *Attorney, Agent, or Firm* — F. Chau & Associates, LLC

(57) ABSTRACT

A structure and formation method for electrically connecting aluminum and copper interconnections stabilize a semiconductor metallization process using an inner shape electrically connecting the aluminum and copper interconnections. To this end, a copper interconnection is disposed on a semiconductor substrate. An interconnection induction layer and an interconnection insertion layer are sequentially formed on the copper interconnection to have a contact hole exposing the copper interconnection. An upper diameter of the contact hole may be formed to be larger than a lower diameter thereof. A barrier layer and an aluminum interconnection are filled in the contact hole. The aluminum interconnection is formed not to directly contact the copper interconnection through the contact hole.

20 Claims, 18 Drawing Sheets

FOREIGN PATENT DOCUMENTS

| | | |
|---|---|---|
| JP | 2004-221118 | 8/2004 |
| JP | 2005-057063 | 3/2005 |
| JP | 2006-147218 | 6/2006 |
| JP | 63-122152 | 5/2010 |
| KR | 1997-0052348 | 7/1997 |
| KR | 1999-027908 | 4/1999 |
| KR | 1020000043904 | 7/2000 |
| KR | 1020010008529 | 2/2001 |
| KR | 1020060008431 | 1/2006 |
| KR | 1020060072383 | 6/2006 |

OTHER PUBLICATIONS

English Abstract for Publication No. 2004-221118.
English Abstract for Publication No. 2005-057063.
English Abstract for Publication No. 1020060008431.
English Abstract for Publication No. 63-122152.
English Abstract for Publication No. 1020000043904.
English Abstract for Publication No. 1020010008529.
English Abstract for Publication No. 1020060072383.
English Abstract for Publication No. 2006-147218.
English Abstract for Publication No. 10-0253329 (1999-0027908).
English Abstract for Publication No. 10-0197121 (1997-0052348).

* cited by examiner

US 8,211,793 B2

STRUCTURES ELECTRICALLY CONNECTING ALUMINUM AND COPPER INTERCONNECTIONS AND METHODS OF FORMING THE SAME

CROSS-REFERENCE TO RELATED APPLICATIONS

This application is a Continuation Application from a U.S. patent application Ser. No. 11/679,723 filed Feb. 27, 2007, now abandoned which claims priority to Korean Application Serial No. 2006-78232, filed Aug. 18, 2006, both of which are herein incorporated by reference in their entirety.

BACKGROUND OF THE INVENTION

1. Field of the Invention

The present invention relates to structures electrically connecting semiconductor metal interconnections and methods of forming the same, and more particularly, to structures electrically connecting aluminum and copper interconnections and methods of forming the same.

2. Description of Related Art

Typically, semiconductor devices have metal interconnections to electrically connect discrete semiconductor elements. The metal interconnections are formed to fill a contact hole penetrating a predetermined region of an interlayer insulating layer while crossing over the top surface of the interlayer insulating layer. The metal interconnections are formed of conductive material having a high current carrying capability. The metal interconnections may be formed by stacking aluminum (Al) and copper (Cu).

The aluminum and copper interconnections make the manufacturing environment in a semiconductor metallization process unstable by diffusing into one another. The semiconductor metallization process may be performed with a barrier pattern interposed between the aluminum interconnection and the copper interconnection so as to stabilize the manufacturing environment. Using the barrier pattern, the manufacturing environment becomes dependent on a shape of a barrier pattern shape. The aluminum and copper interconnections may contact each other depending on the shape of the barrier pattern.

A semiconductor device that is not dependent on the shape of the barrier pattern and a method of fabricating the semiconductor device are suggested by Matsunaga Noriaki, etc. in Japanese Laid-Open Patent Publication No. 2004-221118. According to Japanese Laid-Open Patent Publication No. 2004-221118, a lower interconnection is disposed on a semiconductor substrate, first and second insulating layers are sequentially formed on the lower interconnection, an interconnection hole exposing the lower interconnection is formed in the first and second insulating layers, and a barrier metal layer and via is deposited to fill the interconnection hole.

However, in the invention of Japanese Laid-Open Patent Publication No. 2004-221118, depending on the position of the interconnection hole in the semiconductor substrate, the lower interconnection and the via may come into direct contact at a bottom of the interconnection hole. This is because the interconnection hole may have different numbers of atoms supplied from a barrier metal source target during a semiconductor metallization process in order to form the barrier metal layer at the edge or central region of the semiconductor substrate. Therefore, the barrier metal layer in the interconnection hole may be partially cut off at the edge of the semiconductor substrate, thus allowing the via to directly contact the lower interconnection through the metal layer.

Therefore, a need exists for an interconnection in which an aluminum interconnection is formed not to directly contact a copper interconnection through the contact hole.

SUMMARY OF THE INVENTION

According to an embodiment of the present invention, a structure electrically connecting aluminum and copper interconnections comprises an interconnection induction layer and an interconnection insertion layer defining a contact hole, having a step difference on a sidewall of the contact hole such that a width of the contact hole narrows from an upper part of the contact hole to a lower part thereof, and formed of nitride and oxide, respectively.

According to an embodiment of the present invention, a structure electrically connecting aluminum and copper interconnections comprises an interconnection induction layer, an interconnection filling layer and an interconnection insertion layer defining a contact hole, having respective step differences on a sidewall of the contact hole such that a width of the contact hole narrows from an upper part of the contact hole to a lower part thereof, and formed of first nitride, second nitride and oxide, respectively.

According to an embodiment of the present invention, a structure electrically connecting aluminum and copper interconnections comprises an interconnection induction layer and an interconnection insertion layer defining a contact hole, having a first step difference on a sidewall of the contact hole such that a width of the contact hole narrows from an upper part of the contact hole to a lower part thereof, and formed of first nitride and oxide, respectively, and a contact spacer disposed on the sidewalls of the contact hole to have a second step difference corresponding to the first step difference of the sidewall and formed of second nitride.

According to an embodiment of the present invention, a method of forming a structure electrically connecting aluminum and copper interconnections comprises preparing an interconnection induction layer formed of nitride, forming an interconnection insertion layer formed of oxide on the interconnection induction layer, forming a first hole sequentially penetrating the interconnection insertion layer and the interconnection induction layer, and forming a second hole in the interconnection insertion layer by enlarging the first hole to partially expose a top surface of the interconnection induction layer, the first and second holes form one contact hole.

According to an embodiment of the present invention, a method of forming a structure electrically connecting aluminum and copper interconnections comprises preparing an interconnection induction layer formed of first nitride, sequentially forming an interconnection filling layer formed of second nitride and an interconnection insertion layer formed of oxide on the interconnection induction layer, forming a first hole sequentially penetrating the interconnection insertion layer, the interconnection filling layer and the interconnection induction layer, forming a second hole in the interconnection insertion layer and the interconnection filling layer by enlarging the first hole to partially expose a top surface of the interconnection induction layer, and forming a third hole in the interconnection insertion layer by enlarging the second hole to partially expose a top surface of the interconnection filling layer, the first to third holes forming one contact hole.

According to an embodiment of the present invention, a method of forming a structure electrically connecting aluminum and copper interconnections comprises preparing an interconnection induction layer formed of first nitride, forming an interconnection insertion layer formed of oxide on the interconnection induction layer, forming a first hole sequentially penetrating the interconnection insertion layer and the interconnection induction layer, forming a second hole in the interconnection insertion layer by enlarging the first hole to partially expose a top surface of the interconnection induction layer, the first and second holes forming one contact hole, and forming a contact spacer covering sidewalls of the contact hole and formed of second nitride.

BRIEF DESCRIPTION OF THE DRAWINGS

The invention will be apparent from the description of exemplary embodiments, as illustrated in the accompanying drawings. The drawings are not necessarily to scale, emphasis instead being placed upon illustrating the principles of the invention.

DETAILED DESCRIPTION OF PREFERRED EMBODIMENTS

Structures electrically connecting aluminum and copper interconnections will now be described hereinafter with reference to the accompanying drawings, in which exemplary embodiments of the invention are shown.

Figure 1:
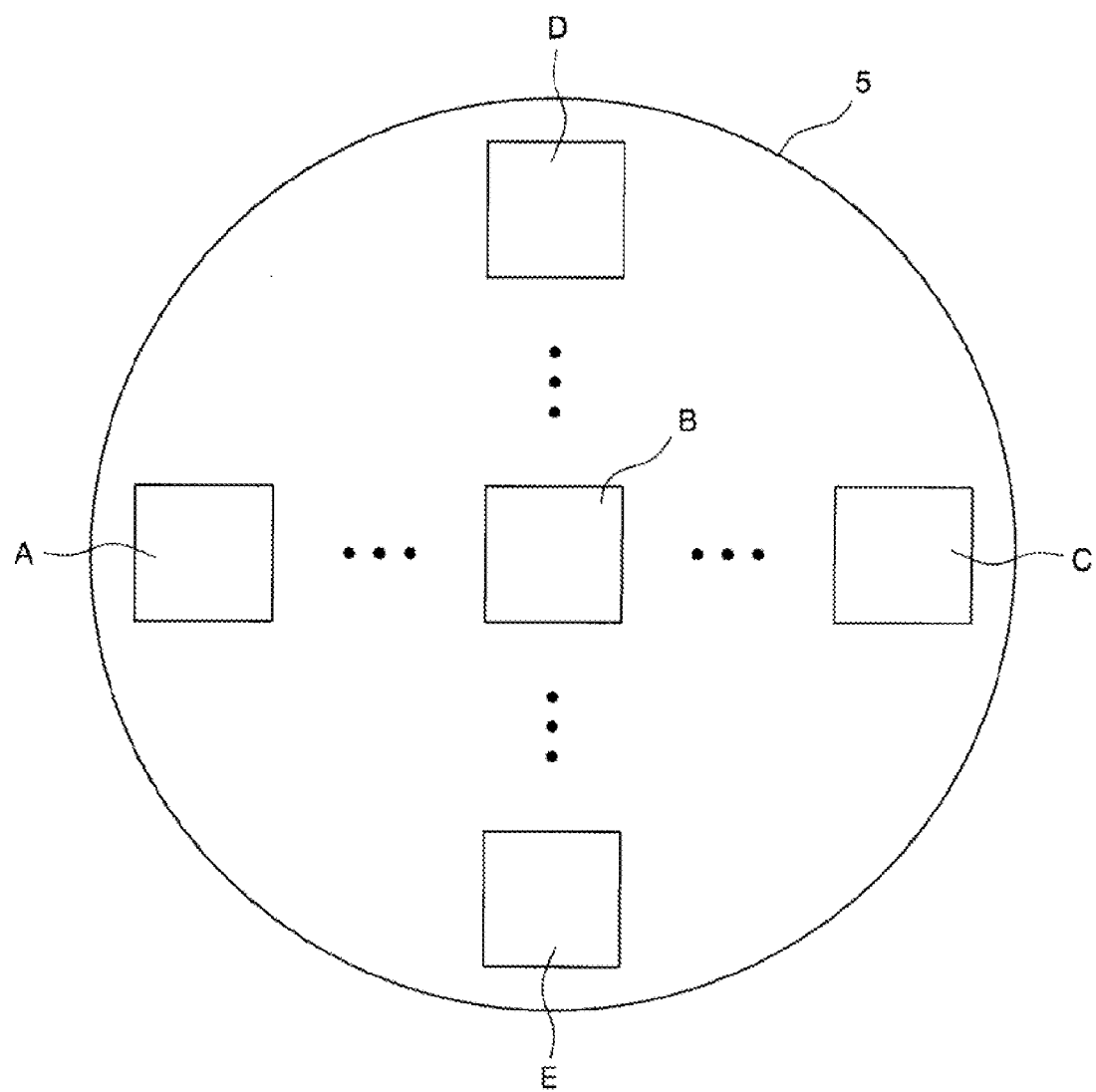
FIG. 1 is a plan view of a semiconductor substrate according to an embodiment of the present invention.
Figure 2:
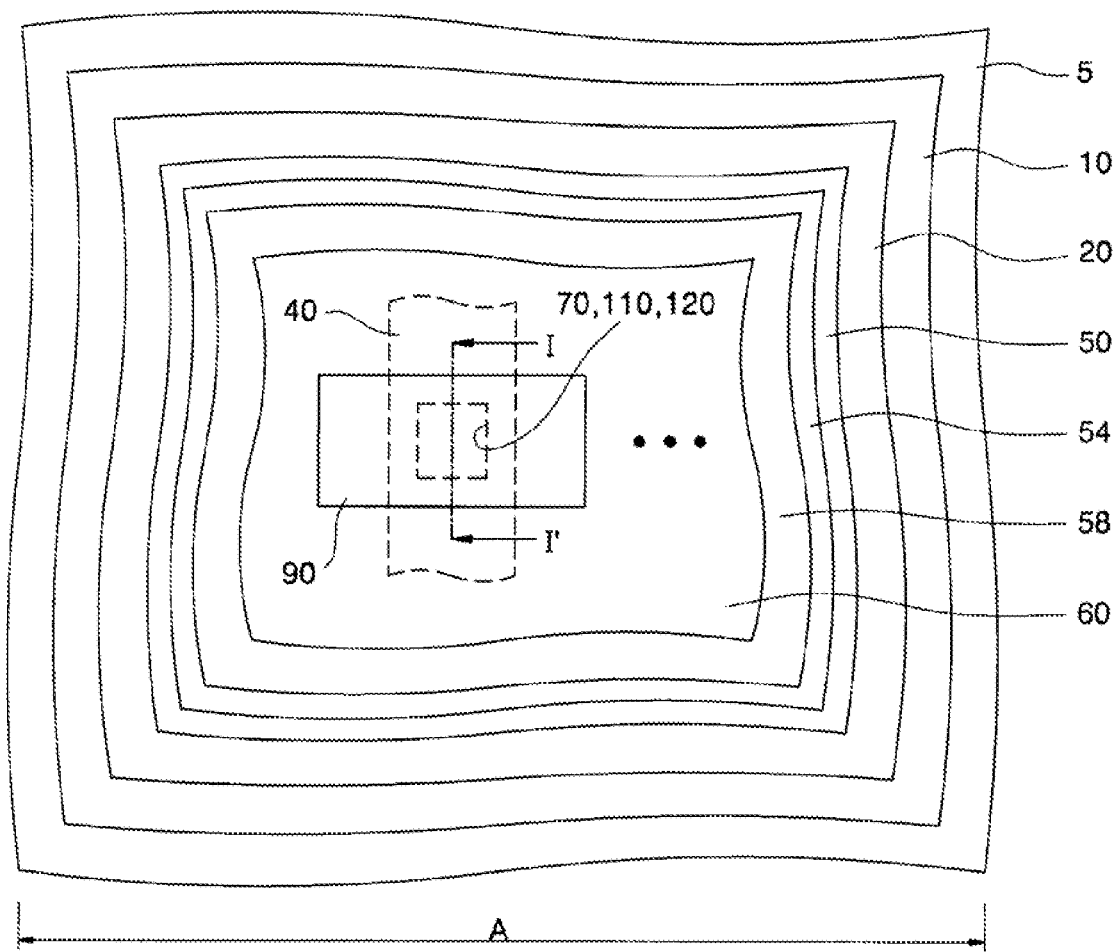
FIG. 2 is a plan view showing a part of the semiconductor substrate of FIG. 1.
Figure 3:
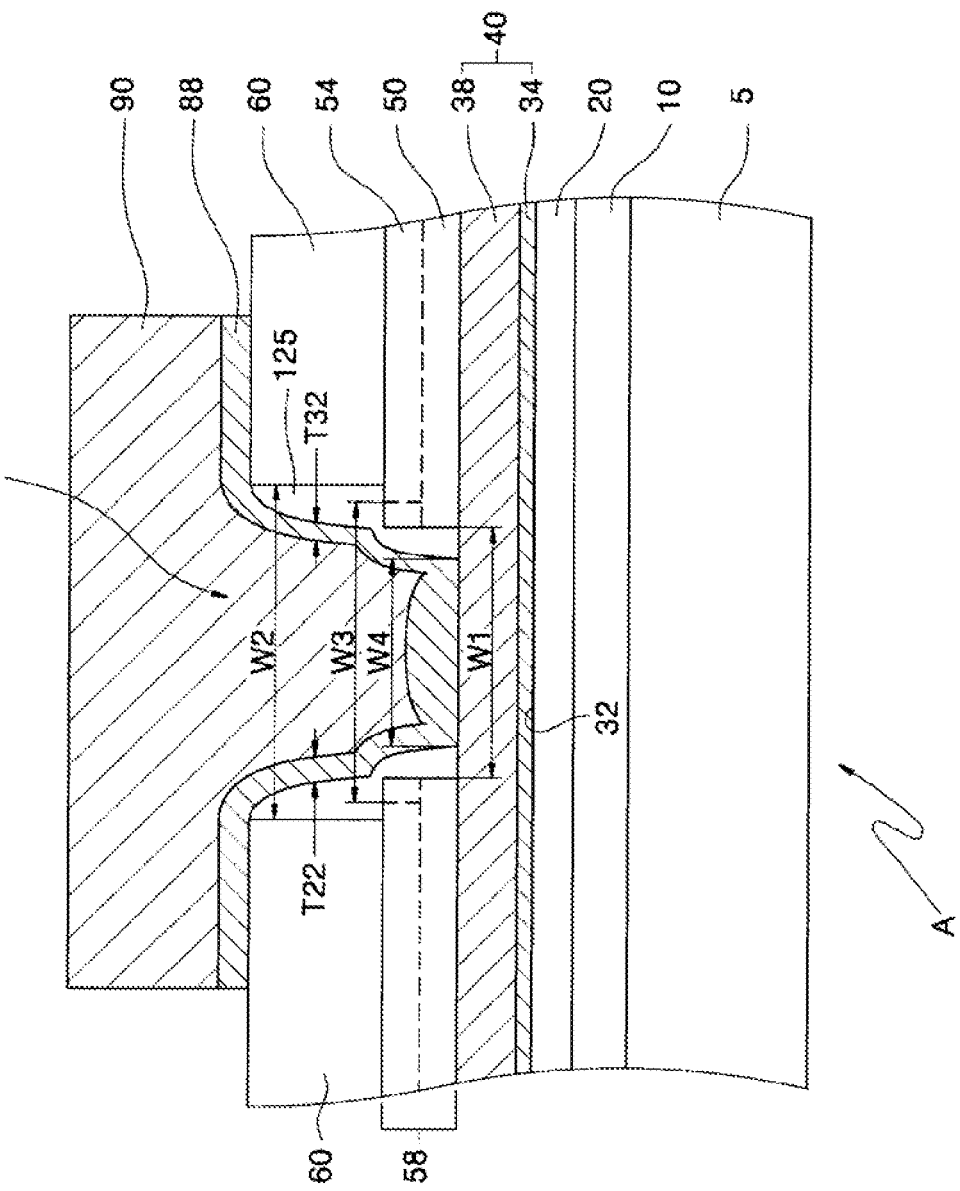
FIG. 3 is a cross-sectional view taken along line I-I' of FIG. 2 which illustrate a semiconductor device according to an embodiment of the present invention.

FIG. 1 is a plan view of a semiconductor substrate according to an embodiment of the present invention, FIG. 2 is a plan view showing a part of the semiconductor substrate of FIG. 1, and FIG. 3 is a cross-sectional view taken along line I-I' of FIG. 2.

Referring to FIGS. 1 and 2, a pad insulating layer 10 is disposed on an entire surface of a semiconductor substrate 5. The pad insulating layer 10 includes an insulating layer having a different etch rate from the semiconductor substrate 5. A plan view such as FIG. 2 can illustrate a predetermined region A of the semiconductor substrate 5 of FIG. 1. The plan view shows the pad insulating layer 10 deposited on the semiconductor substrate 5. The pad insulating layer 10 may be formed of silicon oxide (SiO) or oxide having at least one of metal and non-metal atoms in a lattice of the silicon oxide. Also, the pad insulating layer 10 may be formed of silicon nitride (SiN) or nitride having at least one of metal and non-metal atoms in a lattice of the silicon nitride. The plane view such as FIG. 2 may illustrate other regions, such as B, C, D or E of the semiconductor substrate 5 of FIG. 1.

Referring to FIGS. 1 and 2 again, a copper insertion layer 20 is disposed on the pad insulating layer 10 in the predetermined region A of the semiconductor substrate 5. The copper insertion layer 20 includes an insulating layer having a different etch rate from the pad insulating layer 10. The copper insertion layer 20 may include an insulating layer having substantially the same etch rate as the pad insulating layer 10. The copper insertion layer 20 may be disposed on the pad insulating layer 10 in the other regions B, C, D, and E of the semiconductor substrate 5 of FIG. 1. Therefore, embodiments of the present invention will be first described with reference to the predetermined region A of the semiconductor substrate 5 and then described with references to the other regions B, C, D, and E of the semiconductor substrate 5.

Referring to FIGS. 2 and 3, a copper interconnection 40 having a predetermined width and length is disposed on the copper insertion layer 20 in the predetermined region A of the semiconductor substrate 5, as shown in FIG. 2. The copper interconnection 40 may be buried in the copper insertion layer 20 to have a top surface substantially planar with a top surface of the copper insertion layer 20. The copper interconnection 40 may include a copper seed layer 34 and a copper layer 38. According to an exemplary embodiment of the present invention, a first interconnection induction layer 50 and an interconnection insertion layer 60 are sequentially stacked on the copper interconnection 40. The interconnection insertion layer 60 and the first interconnection induction layer 50 are formed to contact each other and define a first contact hole 70. The first contact hole 70 is formed in the interconnection insertion layer 60 and the first interconnection induction layer 50 to expose the copper interconnection 40.

The first interconnection induction layer 50 includes an insulating layer having a different etch rate from the copper interconnection 40 and the copper insertion layer 20. To this end, the first interconnection induction layer 50 may be formed of nitride. The first interconnection induction layer 50 may be formed of silicon nitride (SiN) or nitride having at least one of metal and non-metal atoms in a lattice of the silicon nitride. The interconnection insertion layer 60 includes an insulating layer having a different etch rate from the first interconnection induction layer 50. The interconnection insertion layer 60 may be formed of oxide. The interconnection insertion layer 60 may be formed of silicon oxide (SiO) or oxide having at least one of metal and non-metal atoms in a lattice of the silicon oxide.

The interconnection insertion layer 60 is formed to expose the first interconnection induction layer 50 through the first contact hole 70. Specifically, an upper diameter W2 of the first contact hole 70 may be formed to be larger than a lower diameter W1 thereof. This allows sidewalls of the first contact hole 70 to have a step difference such that the width of the first contact hole 70 narrows from an upper part of the first contact hole 70 to a lower part thereof.

Referring back to FIGS. 2 and 3, according to an exemplary embodiment of the present invention, the first interconnection induction layer 50, an interconnection filling layer 54 and the interconnection insertion layer 60 may be sequentially stacked on the copper interconnection 40 in the predetermined region A of the semiconductor substrate 5. The interconnection insertion layer 60, the interconnection filling layer 54 and the first interconnection induction layer 50 may be formed to contact each other and define a second contact hole 110. The second contact hole 110 may be formed in the interconnection insertion layer 60, the interconnection filling layer 54 and the first interconnection induction layer 50 to expose the copper interconnection 40.

The first interconnection induction layer 50 and the interconnection filling layer 54 may include an insulating layer having a different etch rate from the copper interconnection 40 and the copper insertion layer 20. To this end, he first interconnection induction layer 50 and the interconnection filling layer 54 may be formed of nitride having silicon (Si)

and nitrogen (N) at different ratios. For example, the first interconnection induction layer 50 and the interconnection filling layer 54 may be formed of nitrogen-rich nitride and silicon-rich nitride, respectively.

Alternatively, the first interconnection induction layer 50 and the interconnection filling layer 54 may be formed of silicon-rich nitride and nitrogen-rich nitride, respectively. The interconnection insertion layer 60 may include an insulating layer having a different etch rate from the interconnection filling layer 54 and the first interconnection induction layer 50. To this end, the interconnection insertion layer 60 may be formed of oxide. The interconnection insertion layer 60 may be formed of silicon oxide (SiO) or oxide having at least one of metal and non-metal atoms in a lattice of the silicon oxide.

The interconnection insertion layer 60 is formed to expose the first interconnection induction layer 50 and the interconnection filling layer 54 through the second contact hole 110. Specifically, an upper diameter W2 of the second contact hole 110 may be formed to be larger than a middle diameter W3 thereof. The middle diameter W3 of the second contact hole 110 may be formed to be larger than a lower diameter W1 of the contact hole 110. This allows sidewalls of the second contact hole 110 to have a step difference such that the width of the second contact hole 110 narrows from an upper part of the second contact hole 110 to a lower part thereof.

Referring back to FIGS. 2 and 3, according to an exemplary embodiment of the present invention, a second interconnection induction layer 58 and the interconnection insertion layer 60 may be sequentially stacked on the copper interconnection 40 in the predetermined region A of the semiconductor substrate 5. When the second interconnection induction layer 58 is disposed on the copper interconnection 40, the first interconnection induction layer 50 and the interconnection filling layer 54 are not disposed on the copper interconnection 40. The interconnection insertion layer 60 and the second interconnection induction layer 58 may be formed to define a third contact hole 120. The third contact hole 120 may be formed in the interconnection insertion layer 60 and the second interconnection induction layer 58 to expose the copper interconnection 40.

The second interconnection induction layer 58 may include an insulating layer having a different etch rate from the copper interconnection 40 and the copper insertion layer 20. To this end, the second interconnection induction layer 58 may be formed of nitride having silicon (Si) and nitrogen (N) in a predetermined ratio in a lattice of silicon nitride (SiN). The interconnection insertion layer 60 may include an insulating layer having a different etch rate from the second interconnection induction layer 58. To this end, the interconnection insertion layer 60 may be formed of oxide. Also, the interconnection insertion layer 60 may be formed of silicon oxide (SiO) or oxide having at least one of metal and non-metal atoms in a lattice of the silicon oxide.

The interconnection insertion layer 60 is formed to expose the second interconnection induction layer 58 through the third contact hole 120. Specifically, an upper diameter W2 of the third contact hole 120 may be formed to be larger than a lower diameter W1 thereof. This allows sidewalls of the third contact hole 120 to have a step difference such that the width of the third contact hole 120 narrows from an upper part of the third contact hole 120 to a lower part thereof. A contact spacer 125 is formed on the sidewalls of the third contact hole 120 to have a step difference corresponding to the step difference of the third contact hole 120. The contact spacer 125 is formed to expose the copper interconnection 40 through a predetermined width W4.

The contact spacer 125 may include nitride having silicon and nitrogen in a different ratio than the second interconnection induction layer 58. Thus, one of the contact spacer 125 and the second interconnection induction layer 58 may be silicon-rich nitride, and the other of nitrogen-rich nitride.

Referring back to FIGS. 2 and 3, according to exemplary embodiments, a barrier pattern 88 is disposed along the sidewalls of the first and second contact holes 70 and 110 and the sidewall of the contact spacer 125 in the third contact hole 120. In FIG. 3, the barrier pattern 88 is shown as disposed on only the contact spacer 125. When the contact spacer 125 is not disposed, as in the first and second contact holes 70 and 110, the barrier pattern 88 may be formed to contact sidewall of the first interconnection induction layer 50, the interconnection filling layer 54 and the interconnection insertion layer 60.

The barrier pattern 88 is asymmetrically formed along the sidewalls of the first and second contact holes 70 and 110 and the sidewall of the contact spacer 125 in the third contact hole 120. In other words, the barrier pattern 88 may be formed to have different thicknesses T22 and T32 on the sidewalls of the first and second contact holes 70 and 110, and the sidewall of the contact spacer 125 in the third contact hole 120, respectively. The barrier pattern 88 may include titanium (Ti), titanium nitride (TiN), tantalum (Ta), tantalum nitride (TaN), or combinations thereof.

An aluminum interconnection 90 is disposed on the barrier pattern 88. The aluminum interconnection 90 may be formed to fill the first to third contact holes 70, 110 and 120. Multiple sets of the aluminum interconnection 90 and the copper interconnection 40 may be disposed in the predetermined region A of the semiconductor substrate 5 through the first, second or third contact holes 70, 110 or 120. In addition, the aluminum interconnections 90 and the copper interconnections 40 may be disposed through the first, second or third contact holes 70, 110 or 120 on the other regions B, C, D and E of the semiconductor substrate 5. Therefore, semiconductor devices 133, 136 and 139 (see FIGS. 11, 15 and 19, respectively) according to exemplary embodiments of the present invention can be implemented to respectively have the first, second and third contact holes 70, 110 and 120 electrically connecting the aluminum interconnection 90 with the copper interconnection 40 in the predetermined region A of the semiconductor substrate 5.

A method of forming the structure electrically connecting aluminum and copper interconnections according to an exemplary embodiment of the present invention will now be described with reference to the accompanying drawings.

FIGS. 4 to 12 are cross-sectional views taken along line I-I' of FIG. 2 illustrating a method of forming a semiconductor device according to an exemplary embodiment of the present invention.

Figure 4:
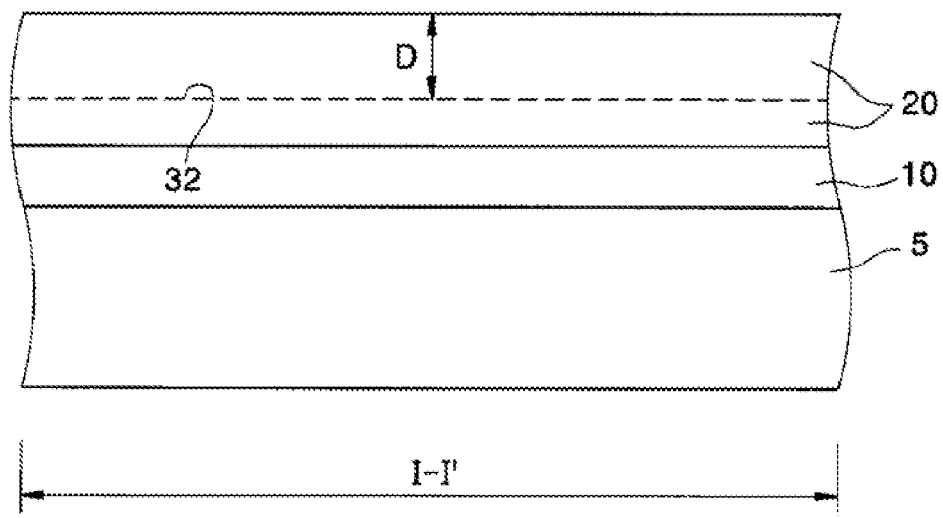
FIGS. 4 to 12 are cross-sectional views taken along line I-I' of FIG. 2 illustrating a method of forming a semiconductor device according to an embodiment of the present invention.

Referring to FIGS. 2 and 4, a pad insulating layer 10 is formed on the semiconductor substrate 5. The pad insulating layer 10 includes an insulating layer having a different etch rate from the semiconductor substrate 5. The pad insulating layer 10 may be formed of silicon oxide (SiO) or oxide having at least one of metal and non-metal atoms in a lattice of the silicon oxide. Also, the pad insulating layer 10 may be formed of silicon nitride (SiN) or nitride having at least one of metal and non-metal atoms in a lattice of the silicon nitride.

A copper insertion layer 20 is formed on the pad interlayer insulating layer 10. The copper insertion layer 20 includes an insulating layer having a different etch rate from the pad insulating layer 10. The copper insertion layer 20 may include an insulating layer having the same etch rate as the pad insulating layer 10. A trench 32 having a predetermined length and width is formed in the copper insertion layer 20. The trench 32 may be formed at a predetermined depth D from the top surface of the copper insertion layer 20.

Figure 5:
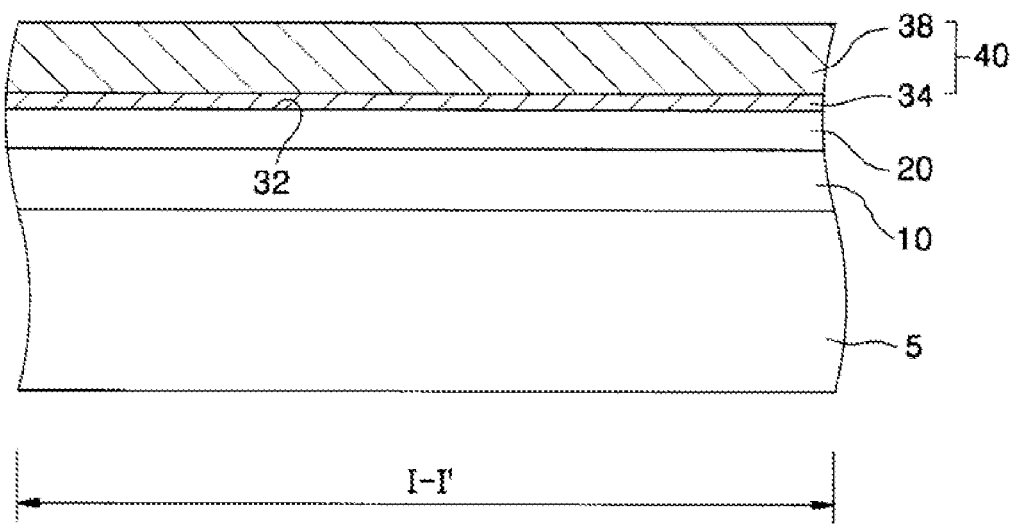

Referring to FIGS. 2 and 5, a copper interconnection 40 filling the trench 32 is formed. The copper interconnection 40 may be formed to expose the top surface of the copper insertion layer 20. The copper interconnection 40 may be formed of a copper seed layer 34 and a copper layer 38. The copper layer 38 may fill the trench 32 of the copper insertion layer 20 through an electroplating process using the copper seed layer 34.

Figure 6:
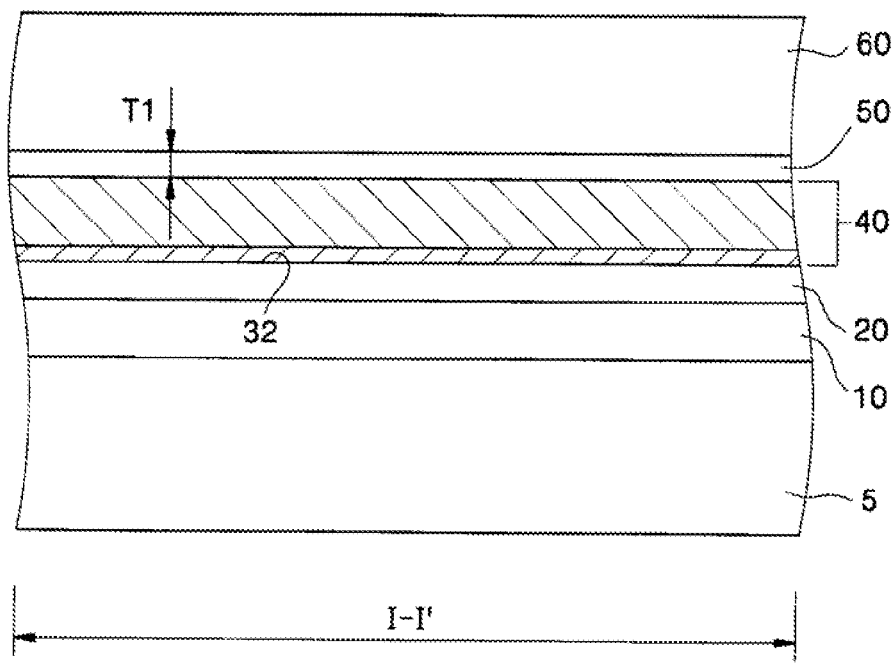

Referring to FIGS. 2 and 6, a first interconnection induction layer 50 is formed on the copper insertion layer 20 to have a predetermine thickness T1. The first interconnection induction layer 50 may be formed to cover the copper interconnection 40. The first interconnection induction layer 50 includes an insulating layer having a different etch rate from the copper insertion layer 20 and the copper interconnection 40, and thus may be formed of nitride. Also, the first interconnection induction layer 50 may be formed of silicon nitride (SiN) or nitride having at least one of metal and non-metal atoms in a lattice of the silicon nitride.

The interconnection insertion layer 60 is formed on the first interconnection induction layer 50. The interconnection insertion layer 60 includes an insulating layer having a different etch rate from the first interconnection induction layer 50 and thus may be formed of oxide. The interconnection insertion layer 60 may be formed of silicon oxide (SiO) or oxide having at least one of metal and non-metal atoms in a lattice of the silicon oxide.

Figure 7:
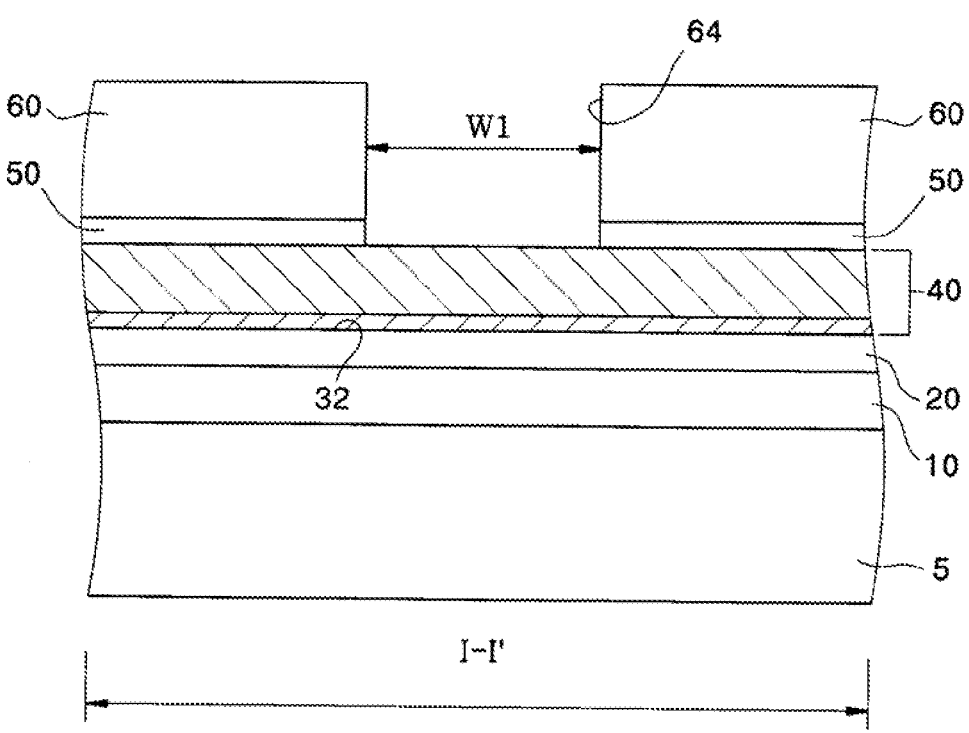

Referring to FIGS. 2 and 7, a photoresist layer (not shown) is formed on the interconnection insertion layer 60. The photoresist layer may be formed to have an opening overlapping the copper interconnection 40. The interconnection insertion layer 60 and the first interconnection induction layer 50 are sequentially etched using the photoresist layer and the copper interconnection 40 as an etching mask and an etch buffer layer, respectively, to form a first hole 64. The first hole 64 may be formed to correspond to the opening of the photoresist layer. Therefore, the first hole 64 may be formed to have a predetermined width W1 and expose the copper interconnection 40.

Figure 8:
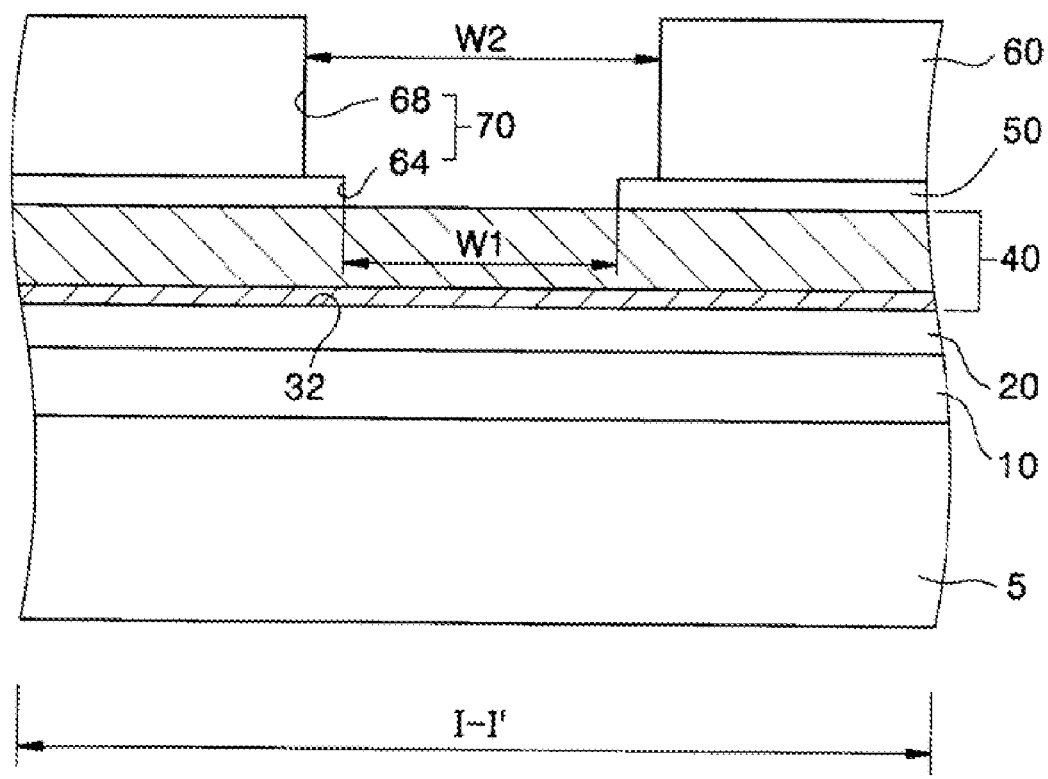

Referring to FIGS. 2 and 8, an etching process is applied to the interconnection insertion layer 60 through the first hole 64 using the photoresist layer as an etching mask, and the copper interconnection 40 and the first interconnection induction layer 50 as etch buffer layers. In the etching process, a portion of the interconnection insertion layer 60 may be removed from sidewall of the first hole 64, so that a second hole 68 can be formed in the interconnection insertion layer 60. The etching process may be performed using one selected from wet and dry etchants. After the second hole 68 is formed, the photoresist layer is removed from the semiconductor substrate 5.

Alternatively, the photoresist layer may be removed from the semiconductor substrate 5 after the first hole 64 is formed. Here, an etching process may be applied to the interconnection insertion layer 60 through the first hole 64 using the copper interconnection 40 and the first interconnection induction layer 50 as etch buffer layers. In the etching process, a portion of the interconnection insertion layer 60 may be isotropically removed from the sidewall of the first hole 64 and top surface of the interconnection insertion layer 60, so that the second hole 68 can be formed in the interconnection insertion layer 60. By the etching process, a diameter W2 of the second hole 68 may be formed to be larger than the diameter W1 of the first hole 64. The first hole 70 and the second hole 68 constitute the first contact hole 70.

Figure 9:
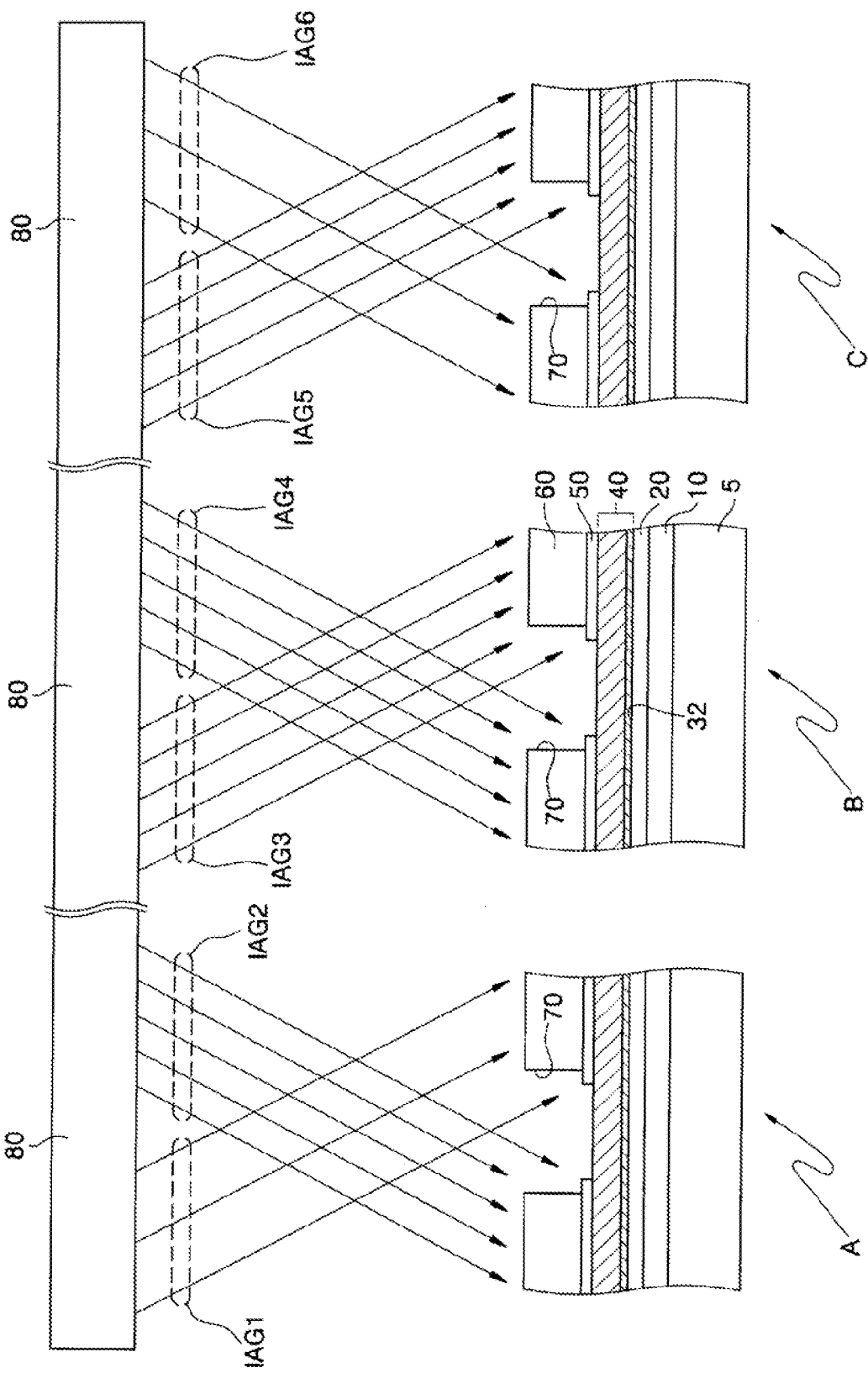

Referring to FIGS. 2 and 9, the semiconductor substrate 5 having the first contact hole 70 is disposed under a barrier metal source target 80. In a semiconductor metallization process, the semiconductor substrate 5 including the predetermined regions A, B, C, D and E of FIG. 1 may be disposed under the barrier metal source target 80. For convenience, only specific regions A, B and C of the semiconductor substrate 5 are illustrated. The barrier metal source target 80 may be formed of titanium (Ti), titanium nitride (TiN), tantalum (Ta) or tantalum nitride (TaN).

When high-energy ions (not shown) are radiated at the barrier metal source target 80, the target atoms are knocked out of the barrier metal source target 80 by collision with the high-energy ions and proceed toward the semiconductor substrate 5. In case that the barrier metal source target 80 is divided into a plurality of areas, the target atoms toward the semiconductor substrate 5 may be classified into incident atom groups IAG1, IAG2, IAG3, IAG4, IAG5 and IAG6 each corresponding to different areas.

Two groups IAG1 and IAG6 among the incident atom groups have less the target atoms than other groups IAG2 to IAG5. This is because the two groups IAG1 and IAG6 interact with the high-energy ions less than the other groups IAG2 to IAG5 through the barrier metal source target 80. More specifically, the high-energy ions may generate more target atoms in a central area of the barrier metal source target 80 than at edges thereof, where the number of the target atoms is proportional to a collision probability between the high-energy ions and the barrier metal source target 80.

Figure 10:
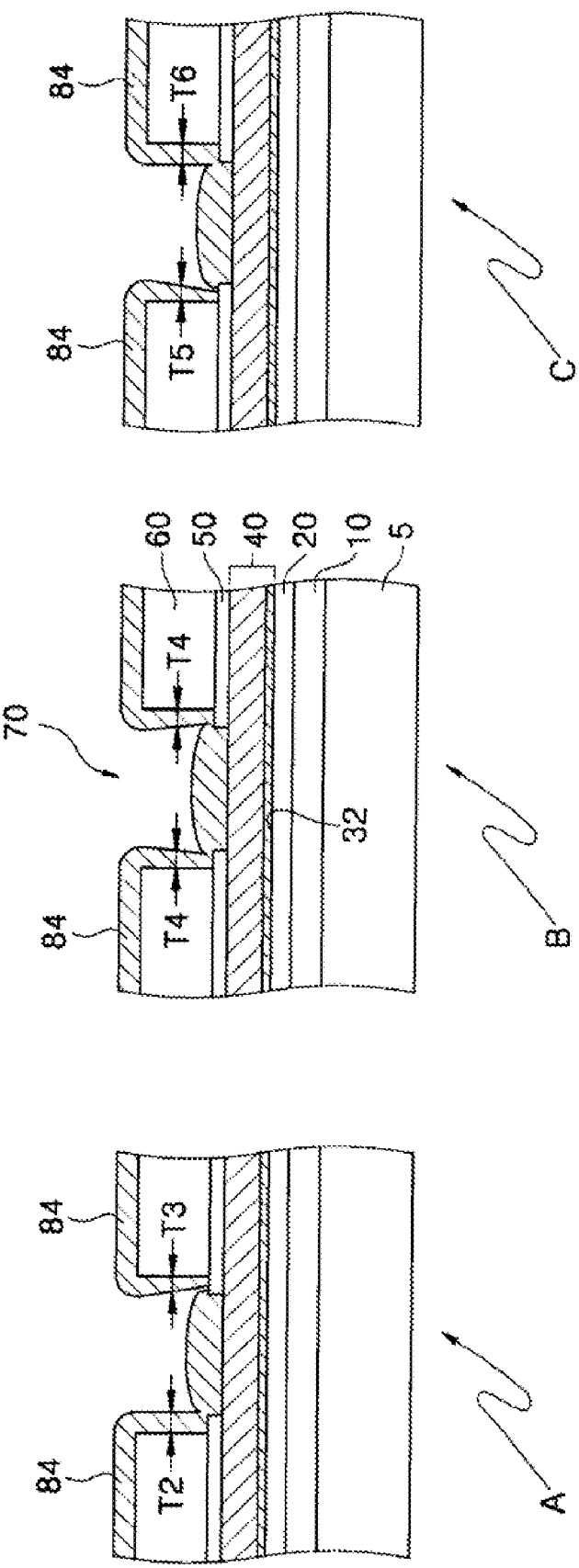

Referring to FIGS. 2 and 10, the incident atom groups IAG1 to IAG6 form a barrier layer 84 in the specific regions A, B and C of the semiconductor substrate 5 of FIG. 1. The barrier layer 84 may be formed by a physical vapor deposition (PVD) technique. The barrier layer 84 can be obtained by radiating the incident atom groups IAG1 to IAG6 onto the semiconductor substrate 5 for a predetermined time. The barrier layer 84 is formed in different shapes in the specific regions A, B and C, respectively. More specifically, the incident atom groups IAG3 and IAG4 radiated, onto and around the central area of the semiconductor substrate 5 have substantially the same number of the target atoms at left and right sides of the first contact hole 70. Therefore, the barrier layer 84 from the central area of the semiconductor substrate 5 and a periphery of the central area thereof may have substantially the same thickness T4 on the left and right sidewalls of the first contact hole 70.

The incident atom groups IAG1 and IAG2 or IAG5 and IAG6 radiated onto the edge A or C of the semiconductor substrate 5 have different numbers of the target atoms at the left and right sides of the first contact hole 70, in comparison with the incident atom groups IAG3 and IAG4 radiated onto and around the central area of the semiconductor substrate 5. Therefore, the edge A or C of the semiconductor substrate 5 has the barrier layer 84 having different thicknesses T2 and T3 or T5 and 16 on the left and right sidewalls of the first contact hole 70. The barrier layer 84 may be formed of titanium (Ti), titanium nitride (TiN), tantalum (Ta), tantalum nitride (TaN) or combinations thereof.

The barrier layer 84 may be simultaneously formed in other regions D and E of the semiconductor substrate 5 as well as the specific regions A, B and C. The regions D and E of the semiconductor substrate 5 other than the specific regions A, B and C may have incident atom groups (not shown) having different numbers of the target atoms at the left and right sides of the first contact hole 70, similar to the edge A or C of the semiconductor substrate 5. Therefore, the regions D and E of the semiconductor substrate 5 other than the specific regions A, B and C may have the barrier layer 84 having the different thicknesses T2 and T3 or T5 and T6 on the left and right sidewalls of the first contact hole 70. In this way, the barrier layer 84 may be formed on the entire surface of the semiconductor substrate 5 to have the different thicknesses along the sidewall of the first contact holes 70.

When having the different thicknesses along the sidewall of the first contact hole 70, the barrier layer 84 may be partially opened under the left or right sidewall of the first contact hole 70 in the edge of the semiconductor substrate 5. As the bottom surface of the first contact hole 70 becomes far from the top surface of the interconnection insertion layer 60, this may become severe. The barrier layer 84 may be formed to expose the part, which is partially opened under the left or right sidewall of the first contact hole 70 in the edge of the semiconductor substrate 5, on a top surface of the interconnection induction layer 50. Therefore, when having the different thicknesses along the sidewall of the first contact hole 70, the barrier layer 84 is formed over an entire surface of the copper interconnection 40 exposed through the interconnection induction layer 50. Also in the regions D and E of the semiconductor substrate 5 other than the specific regions A, B and C, the interconnection induction layer 50 is disposed such that open portions of the barrier layer 84 do not expose the copper interconnection 40.

Figure 11:
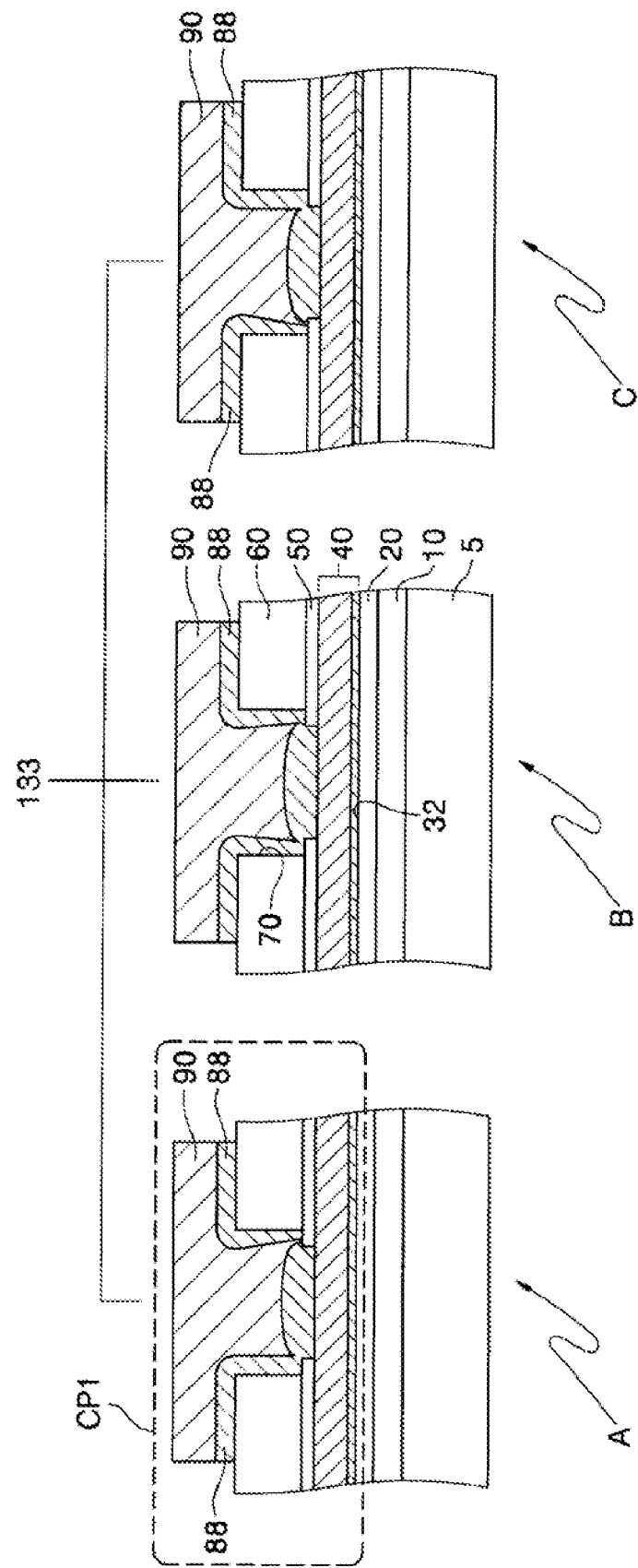
Figure 12:
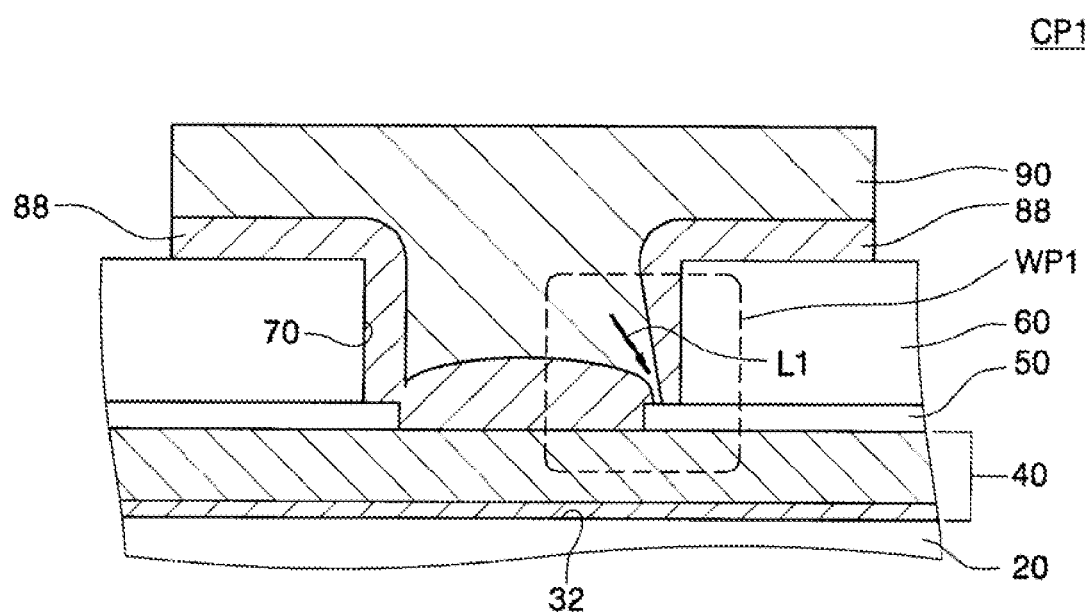

Referring to FIGS. 2, 11 and 12, an aluminum layer is formed on the barrier layer 84. The aluminum layer may be formed by at least one of a PVD technique and a chemical vapor deposition (CVD) technique. Photoresist patterns (not shown) may be formed on the aluminum layer. Using the photoresist patterns as etching masks, the aluminum layer and the barrier layer 84 disposed in the specific regions A, B and C of the semiconductor substrate 5 of FIG. 1 are etched, and thus aluminum interconnections 90 and barrier patterns 88 are formed. The aluminum interconnections 90 may be formed to fill the first contact holes 70, respectively. After the formation of the barrier patterns 88 and the aluminum interconnections 90, the photoresist patterns are removed from the semiconductor substrate 5.

In order to describe a positional relationship of the barrier pattern 88, the aluminum interconnection 90 and the copper interconnection 40 in the first contact hole 70, a check point CP1 of FIG. 11 is shown in FIG. 12. The barrier pattern 88 is partially opened in the first contact hole 70 of the edge A or C of the semiconductor substrate 5 due to the shape of the barrier layer 84 shown in FIG. 10 and thus may have a weak point WP1 of FIG. 12.

The barrier patterns 88 are formed to expose the first interconnection induction layer 50 instead of the copper interconnection 40 at the weak point WP1. This can be enabled by a step difference of the sidewall of the first contact hole 70. Therefore, atoms of the copper interconnection 40 are covered by the first interconnection induction layer 50 and thus cannot interact with atoms of the aluminum interconnection 90 along a flow line L1. Likewise, in the region D or E of FIG. 1 other than the specific regions A, B and C of the semiconductor substrate 5, interaction between atoms of the aluminum interconnection 90 and the copper interconnection 40 can be substantially prevented by the first interconnection induction layer 50.

Subsequently, the first interconnection induction layer 50 can substantially prevent interaction between atoms of the aluminum interconnection 90 and the copper interconnection 40 in the first contact hole 70 on the entire surface of the semiconductor substrate 5. Consequently, the semiconductor device 133, according to an exemplary embodiment of the present invention, can be embodied using the first contact hole 70 electrically connecting the aluminum interconnection 90 with the copper interconnection 40 on the entire surface of the semiconductor substrate 5.

Next, a method of forming the structure electrically connecting aluminum and copper interconnections according to an exemplary embodiment of the present invention will be described with reference to the accompanying drawings. FIGS. 13 to 16 are cross-sectional views taken along line I-I' of FIG. 2 illustrating a method of forming a semiconductor device according to an exemplary embodiment of the present invention, wherein a semiconductor substrate is formed having a copper interconnection through the methods shown in FIGS. 4 and 5.

Figure 13:
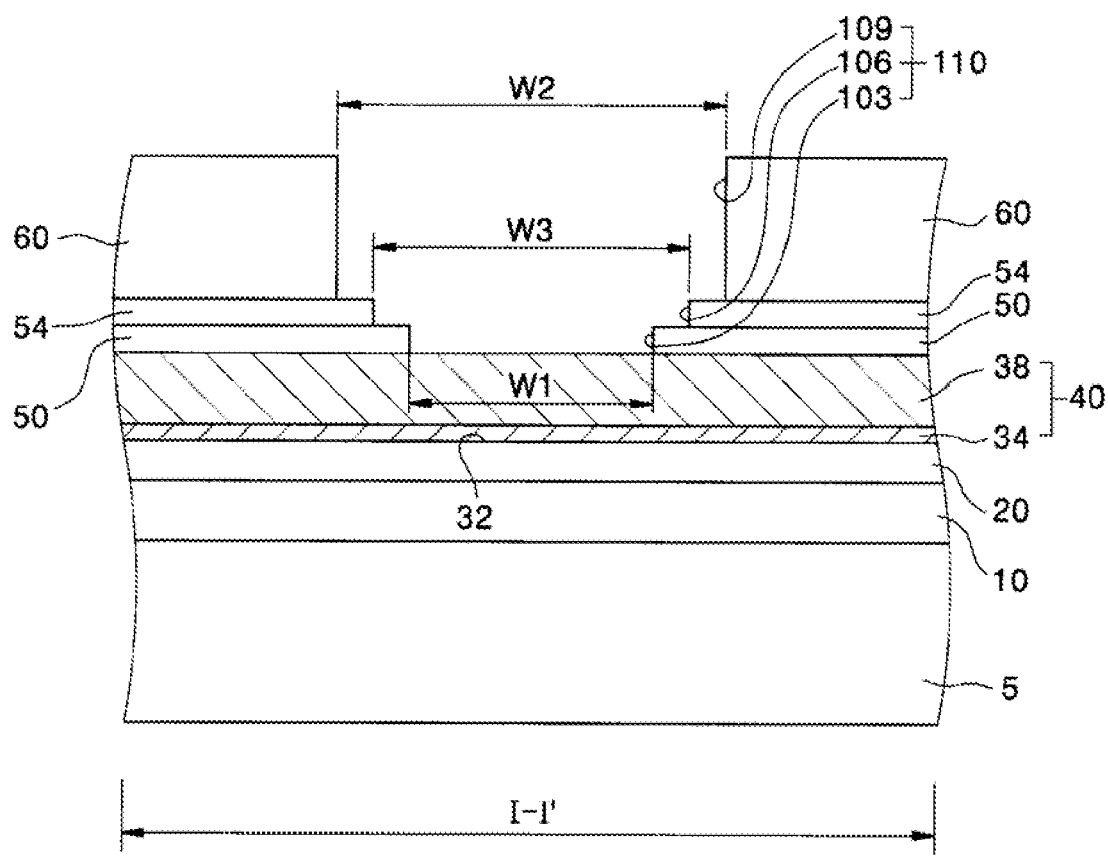
FIGS. 13 to 16 are cross-sectional views taken along line I-I' of FIG. 2 illustrating a method of forming a semiconductor device according to an exemplary embodiment of the present invention.

Referring to FIGS. 2 and 13, a first interconnection induction layer 50, the interconnection filling layer 54, and the interconnection insertion layer 60 are sequentially formed on the copper insertion layer 20. The interconnection insertion layer 60, the interconnection filling layer 54, and the first interconnection induction layer 50 are formed to cover the copper interconnection 40. The first interconnection induction layer 50 and the interconnection filling layer 54 include nitrides having silicon (Si) and nitrogen (N) at different ratios in a lattice of silicon nitride, respectively. To this end, the first interconnection induction layer 50 and the interconnection filling layer 54 may be formed of silicon-rich nitride and nitrogen-rich nitride, respectively. Also, the first interconnection induction layer 50 and the interconnection filling layer 54 may be formed of nitrogen-rich nitride and silicon-rich nitride, respectively.

The interconnection insertion layer 60, the interconnection filling layer 54, and the first interconnection induction layer 50 are formed to define a second contact hole 110. The second contact hole 110 is formed to expose the copper interconnection 40. The second contact hole 110 includes first, second and third holes 103, 106 and 109, which are in the first interconnection induction layer 50, the interconnection filling layer 54 and the interconnection insertion layer 60, respectively. A diameter W1 of the first hole 103 may be formed to be smaller than a diameter W3 of the second hole 106, and the diameter W3 of the second hole 106 may be formed to be smaller than a diameter W2 of the third hole 109. Here, the first to third holes 103, 106 and 109 are formed by the following methods. According to a method of forming the first hole 103, a photoresist layer (not shown) having an opening is formed on the interconnection insertion layer 60. Using the photoresist layer as an etching mask and the copper interconnection 40 as an etch buffer layer, the interconnection insertion layer 60, the interconnection filling layer 54 and the first interconnection induction layer 50 are sequentially etched. The photoresist layer is removed from the semiconductor substrate 5.

According to a method of forming the second hole 106, an etching process is applied to the interconnection insertion layer 60 and the interconnection filling layer 54 through the first hole 103 using the first interconnection induction layer 50 and the copper interconnection 40 as etch buffer layers. In order to form the second hole 106, the etching process may be performed using one of wet and dry etchants. The second hole 106 can be formed by partially expanding the first hole 103. According to a method of forming the third hole 109, an etching process is applied to the interconnection insertion layer 60 through the second hole 106 using the interconnection filling layer 54, the first interconnection induction layer 50, and the copper interconnection 40 as etch buffer layers. In order to form the third hole 109, the etching process may be performed using one of wet and dry etchants. The third hole 109 can be formed by partially expanding the second hole 106.

Figure 14:
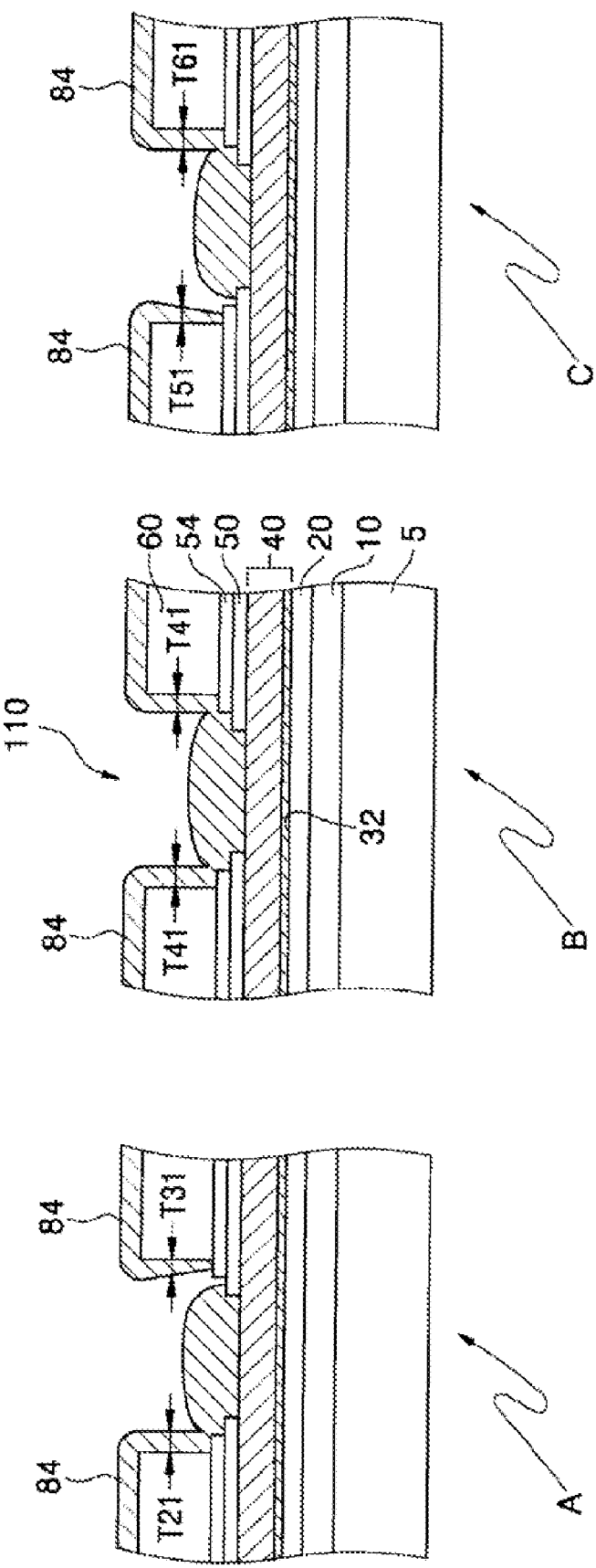

Referring to FIGS. 2 and 14, the semiconductor substrate 5 having the second contact hole 110 is disposed under the barrier metal source target 80 of FIG. 9. In order to perform a semiconductor metallization process, the semiconductor substrate 5 may be disposed under the barrier metal source target 80 in the regions B, C, D and E of FIG. 1 as well as the predetermined region A. For convenience, only specific regions A, B and C of the semiconductor substrate 5 are illustrated. The barrier metal source target 80 may be formed of titanium (Ti), titanium nitride (TiN), tantalum (Ta) or tantalum nitride (TaN).

The barrier metal source target 80 may form a barrier layer 84 in the specific regions A, B and C of the semiconductor substrate 5 using the incident atom groups IAG1 to IAG6 of FIG. 9. The barrier layer 84 may be formed of titanium (Ti), titanium nitride (TiN), tantalum (Ta), tantalum nitride (TaN), or combinations thereof. The incident atom groups IAG3 and IAG4 radiated onto and around the central area of the semiconductor substrate 5 have substantially the same number of the target atoms at left and right sides of the second contact hole 110. Therefore, the barrier layer 84 of the central area of the semiconductor substrate 5 may have substantially the same thickness T41 on left and right sidewalls of the second contact hole 110.

The incident atom groups IAG1 and IAG2 or IAG5 and IAG6 radiated onto the edge A or C of the semiconductor substrate 5 have relatively different numbers of the target atoms at left and right sides of the second contact hole 110, in comparison with the incident atom groups IAG3 and IAG4 radiated onto and around the central area of the semiconductor substrate 5. Therefore, the barrier layer 84 at the edge A or C of the semiconductor substrate 5 has different thicknesses T21 and T31 or T51 and T61 on the left and right sidewalls of the second contact hole 110.

The barrier layer 84 may be simultaneously formed in the other regions D and E of the semiconductor substrate 5 as well as in the specific regions A, B and C. The regions D and E of the semiconductor substrate 5 other than the specific regions A, B and C may have incident atom groups (not shown) having different numbers of the target atoms at left and right sides of the second contact hole 110, similar to the edge A or C of the semiconductor substrate 5. The regions D and E of the semiconductor substrate 5 other than the specific regions A, B and C may have the barrier layer 84 having the different thicknesses T21 and T31 or T51 and T61 on the left and right sidewalls of the second contact hole 110. In this way, the barrier layer 84 may be formed on the entire surface of the semiconductor substrate 5 to have the different thicknesses along the sidewall of the second contact hole 110.

When having the different thicknesses along the sidewall of the second contact hole 110, the barrier layer 84 may be partially opened under the left or right sidewall of the second contact hole 110 in the edge of the semiconductor substrate 5. As the bottom surface of the second contact hole 110 becomes far from the top surface of the interconnection insertion layer 60, this may become severe. The barrier layer 84 may be formed to expose the part, which is partially opened under the left or right sidewall of the second contact hole 110 in the edge of the semiconductor substrate 5, on the top surface of the interconnection induction layer 50 or the interconnection filling layer 54. When having the different thicknesses along the sidewall of the second contact hole 110, the barrier layer 84 is formed to cover an entire surface of the copper interconnection 40 exposed through the interconnection induction layer 50 or the interconnection filling layer 54. Also in the regions D and E of the semiconductor substrate 5 other than the specific regions A, B and C, open portions of the barrier layer 84 are filled using the first interconnection induction layer 50 or the interconnection filling layer 54 such that the copper interconnection 40 is not exposed.

Figure 15:
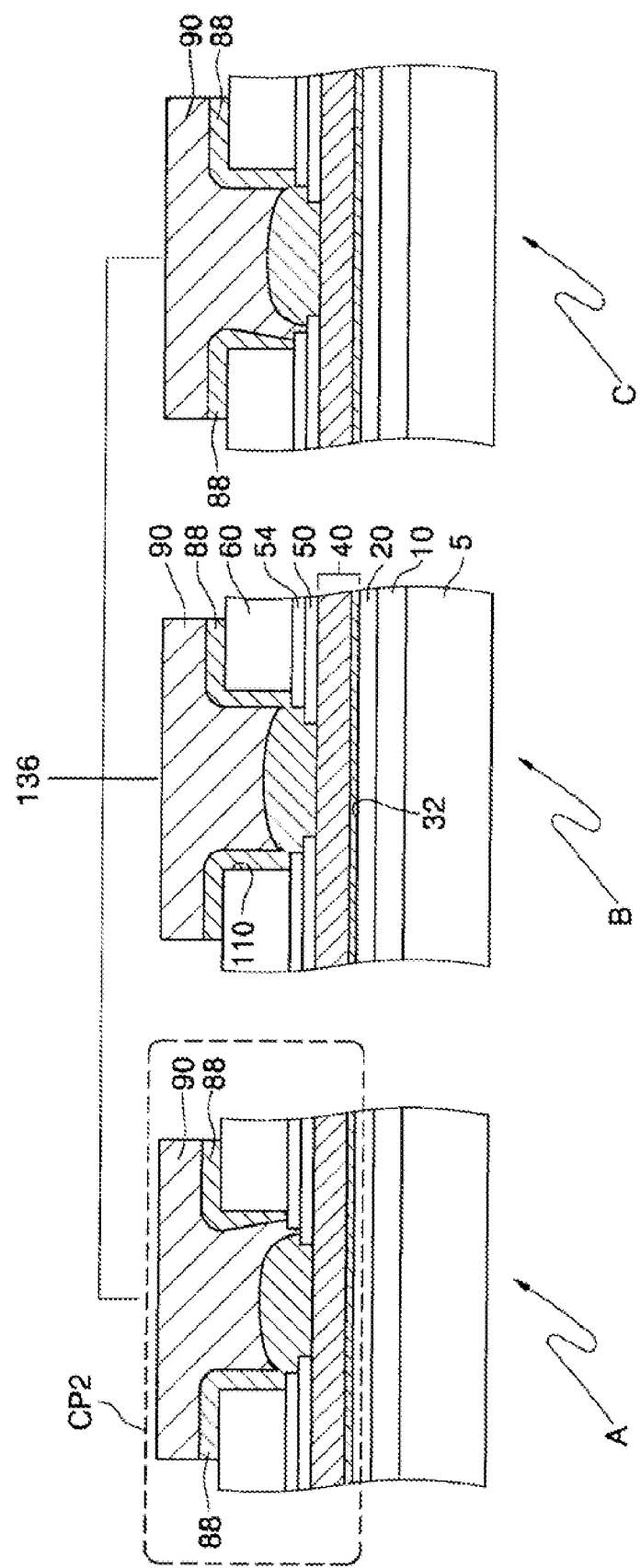
Figure 16:
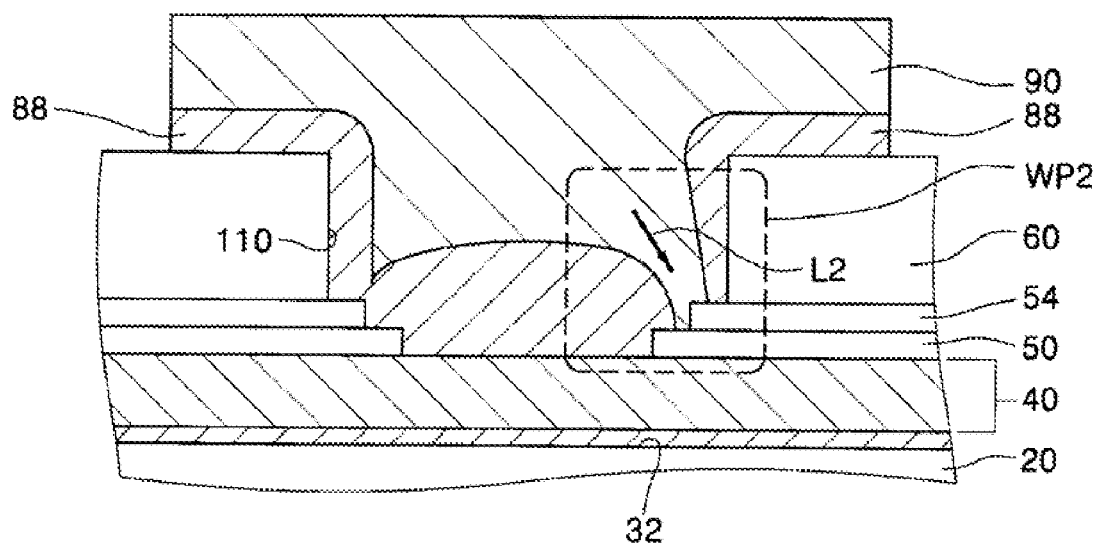

Referring to FIGS. 2, 15 and 16, an aluminum layer is formed on the barrier layer 84. Photoresist patterns (not shown) may be formed on the aluminum layer. Using the photoresist patterns as etching masks, the aluminum layer and the barrier layer 84 disposed in the specific regions A, B and C of the semiconductor substrate 5 of FIG. 1 are etched, and thus aluminum interconnections 90 and barrier patterns 88 are formed. The aluminum interconnections 90 may be formed to fill the second contact holes 110, respectively. After the formation of the barrier patterns 88 and the aluminum interconnections 90, the photoresist patterns are removed from the semiconductor substrate 5.

In order to describe the positional relationship of the barrier patterns 88, the aluminum interconnection 90 and the copper interconnection 40 in the second contact hole 110, a check point CP2 of FIG. 15 is shown in FIG. 16. The barrier pattern 88 is partially opened in the second contact hole 110 of the edge A or C of the semiconductor substrate 5 due to the shape of the barrier layer 84 shown in FIG. 14 and thus may have a weak point WP2 of FIG. 16.

The barrier patterns 88 are formed to expose the first interconnection induction layer 50 or the interconnection filling layer 54 instead of the copper interconnection 40 at the weak point WP2. This can be enabled by a step difference of the sidewall of the second contact hole 110. Therefore, atoms of the copper interconnection 40 are covered by the first interconnection induction layer 50 or the interconnection filling layer 54 and thus cannot interact with atoms of the aluminum interconnection 90 along a flow line L2. Likewise, in the region D or E of FIG. 1 other than the specific regions A, B and C of the semiconductor substrate 5, interaction between atoms of the aluminum interconnection 90 and the copper interconnection 40 can be substantially prevented by the first interconnection induction layer 50 or the interconnection filling layer 54.

The first interconnection induction layer 50 or the interconnection filling layer 54 can substantially prevent interaction between atoms of the aluminum interconnection 90 and the copper interconnection 40 in the second contact hole 110 on the entire surface of the semiconductor substrate 5. Consequently, the semiconductor device 136 according to an exemplary embodiment of the present invention can be embodied, using the second contact hole 110 electrically connecting the aluminum interconnection 90 with the copper interconnection 40 on the entire surface of the semiconductor substrate 5.

A method of forming the structure electrically connecting aluminum and copper interconnections according to an exemplary embodiment of the present invention will now be described with reference to the accompanying drawings, FIGS. 17 to 20 are cross-sectional views taken along line I-I' of FIG. 2 illustrating a method of forming a semiconductor device according to an exemplary embodiment of the present invention, wherein a semiconductor substrate is formed having a copper interconnection through the method shown in FIGS. 4 and 5.

Figure 17:
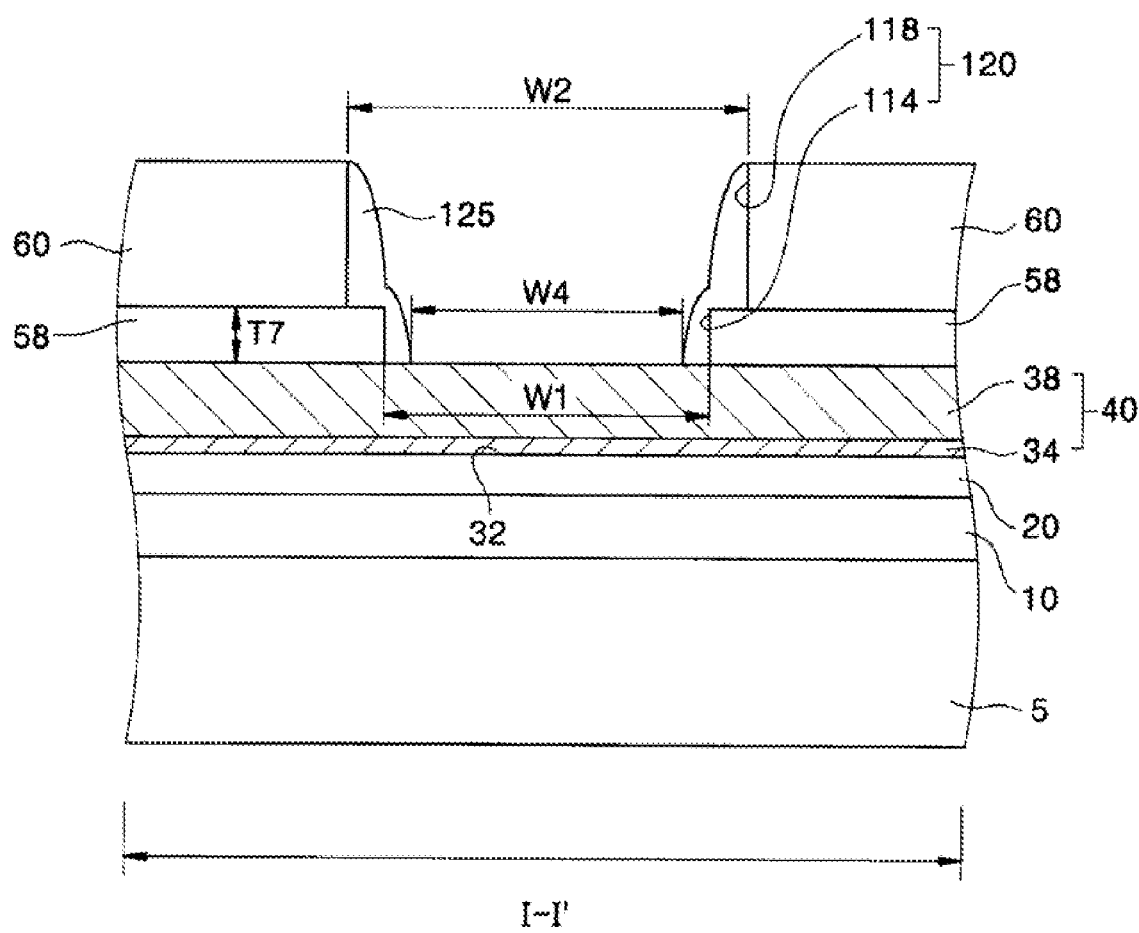
FIGS. 17 to 20 are cross-sectional views taken along line I-I' of FIG. 2 illustrating a method of forming a semiconductor device according to an exemplary embodiment of the present invention.

Referring to FIGS. 2 and 17, the second interconnection induction layer 58 and the interconnection insertion layer 60 are sequentially formed on a copper insertion layer 20 according to an exemplary embodiment of the present invention. The interconnection insertion layer 60 and the second interconnection induction layer 58 are formed to cover a copper interconnection 40. The second interconnection induction layer 58 is formed to have a thickness T7 different from the thickness T1 of the first interconnection induction layer 50 of FIG. 6. The second interconnection induction layer 58 includes nitride. To this end, the second interconnection induction layer 58 may be formed of nitride having silicon (Si) and nitrogen (N) in a predetermined ratio in a lattice of silicon nitride (SiN). The interconnection insertion layer 60 includes oxide. To this end, the interconnection insertion layer 60 may be formed of silicon oxide (SiO) or oxide having at least one of metal and non-metal atoms in a lattice of the silicon oxide.

The interconnection insertion layer 60 and the second interconnection induction layer 58 are formed to define a third contact hole 120. The third contact hole 120 is formed to expose the copper interconnection 40. The third contact hole 120 includes first and second holes 114 and 118, which are disposed in the second interconnection induction layer 58 and the interconnection insertion layer 60, respectively. A diameter W1 of the first hole 114 may be formed to be smaller than a diameter W2 of the second hole 118. The first and second holes 114 and 118 are formed by the following exemplary methods in which to form the first hole 114, a photoresist layer (not shown) having an opening is formed on the interconnection insertion layer 60. Using the photoresist layer as an etching mask and the copper interconnection 40 as an etch buffer layer, the interconnection insertion layer 60 and the second interconnection induction layer 58 are sequentially etched. The photoresist layer is removed from the semiconductor substrate 5.

According to an exemplary method of forming the second hole 118, an etching process is performed to the interconnection insertion layer 60 through the first hole 114 using the second interconnection induction layer 58 and the copper interconnection 40 as etch buffer layers. In order to form the second hole 118, the etching process may be performed using one of wet and dry etchants. The second hole 118 can be formed by partially expanding the first hole 114.

A contact spacer 125 covering sidewall of the third contact hole 120 is formed. The contact spacer 125 is formed to expose the copper interconnection 40 through a predetermined width W4. The contact spacer 125 includes nitride having silicon and nitrogen at substantially the same ratio as the second interconnection induction layer 58. In addition, the contact spacer 125 may include nitride having silicon and nitrogen in a different ratio than the second interconnection induction layer 58. To this end, the contact spacer 125 and the second interconnection induction layer 58 may be formed of silicon-rich nitride and nitrogen-rich nitride, respectively. Also, the contact spacer 125 and the second interconnection induction layer 58 may be formed of nitrogen-rich nitride and silicon-rich nitride, respectively.

Figure 18:
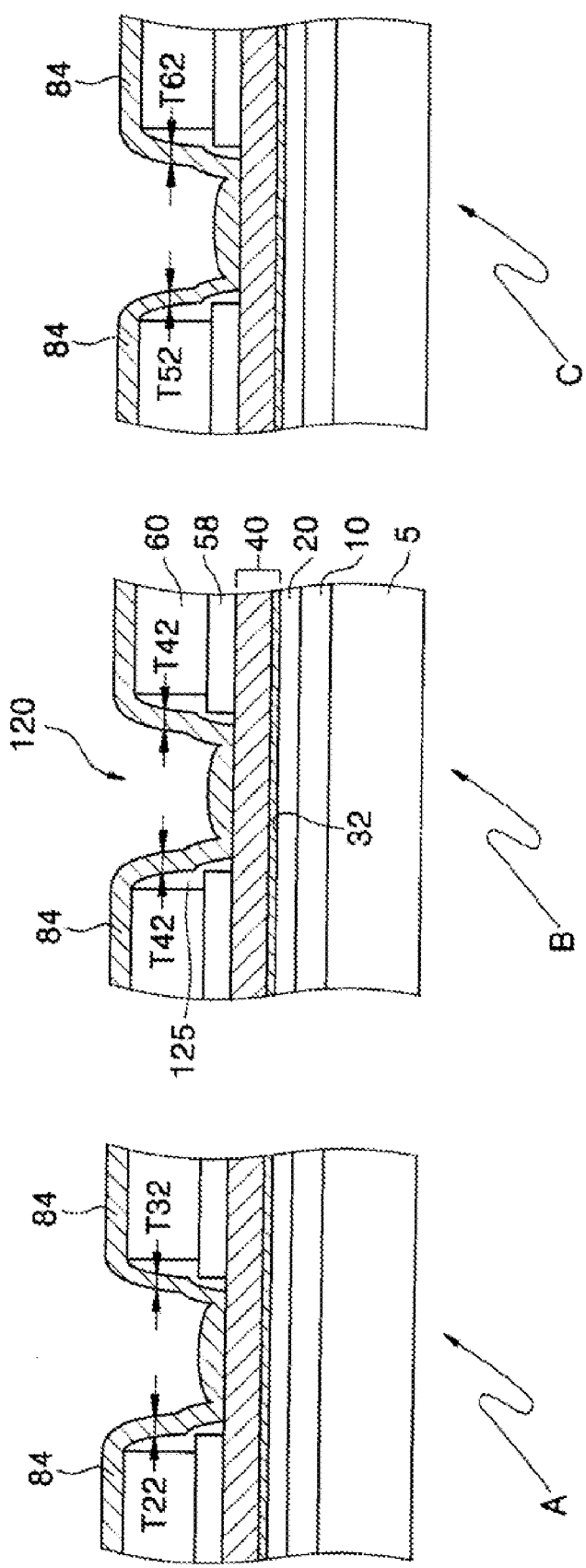

Referring to FIGS. 2 and 18, the semiconductor substrate 5 having the third contact hole 120 is disposed under the barrier metal source target 80 of FIG. 9. In order to easily perform a semiconductor metallization process, the semiconductor substrate 5 may be disposed under the barrier metal source target 80 in the regions B, C, D and E of FIG. 1 as well as in the predetermined region A. For convenience, only specific regions A, B and C of the semiconductor substrate 5 are illustrated. The barrier metal source target 80 may be formed of titanium (Ti), titanium nitride (TiN), tantalum (Ta) or tantalum nitride (TaN).

The barrier metal source target 80 may form a barrier layer 84 in the specific regions A, B and C of the semiconductor substrate 5 using the incident atom groups IAG1 to IAG6 of FIG. 9. The barrier layer 84 may be formed of titanium (Ti), titanium nitride (TiN), tantalum (Ta), tantalum nitride (TaN), or combinations thereof. The incident atom groups IAG3 and IAG4 radiated onto and around the central area of the semiconductor substrate 5 have substantially the same number of the target atoms at left and right sides of the third contact hole 120. Therefore, the central area of the semiconductor substrate 5 may have the barrier layer 84 having substantially the same thickness T42 on left and right sidewalls of the third contact hole 120.

The incident atom groups IAG1 and IAG2 or IAG5 and IAG6 radiated onto the edge A or C of the semiconductor substrate 5 have different numbers of the target atoms at left and right sides of the third contact hole 120, in comparison with the incident atom groups IAG3 and IAG4 radiated onto the central area of the semiconductor substrate 5. Therefore, the edge A or C of the semiconductor substrate 5 has the barrier layer 84 having different thicknesses T22 and T32 or T52 and T62 on the left and right sidewalls of the third contact hole 120.

The barrier layer 84 may be simultaneously formed in the other regions D and E of the semiconductor substrate 5 as well as in the specific regions A, B and C. The regions D and E of the semiconductor substrate 5 other than the specific regions A, B and C may have incident atom groups (not shown) having different numbers of the target atoms at the left and right sides of the third contact hole 120, similar to the edge A or C of the semiconductor substrate 5. Therefore, the regions D and E of the semiconductor substrate 5 other than the specific regions A, B and C may have the barrier layer 84 having the different thicknesses T22 and T32 or T52 and T62 on the left and right sidewalls of the third contact hole 120. In this way, the barrier layer 84 may be formed on the entire surface of the semiconductor substrate 5 to have the different thicknesses along the sidewall of the third contact hole 120.

In addition, when having the different thicknesses along the sidewall of the third contact hole 120, the barrier layer 84 is not opened under the left or right sidewall of the third contact hole 120 in the edge of the semiconductor substrate 5, and the contact spacer 125 collects the incident atom groups IAG1 to IAG6 on the bottom surface of the third contact hole 120. More specifically, the contact spacer 125 makes the inner shape of the third contact hole 120 smooth in comparison with the inner shapes of the first and second contact holes 70 and 110, thus helping movement of the target atoms of the incident atom groups IAG1 to IAG6 in the third contact hole 120. Therefore, when having different thicknesses along the sidewall of the third contact hole 120, the barrier layer 84 is formed not to expose the copper interconnection 40. Also in the regions D and E of the semiconductor substrate 5 other than the specific regions A, B and C, the copper interconnection 40 is not exposed through the barrier layer 84.

Figure 19:
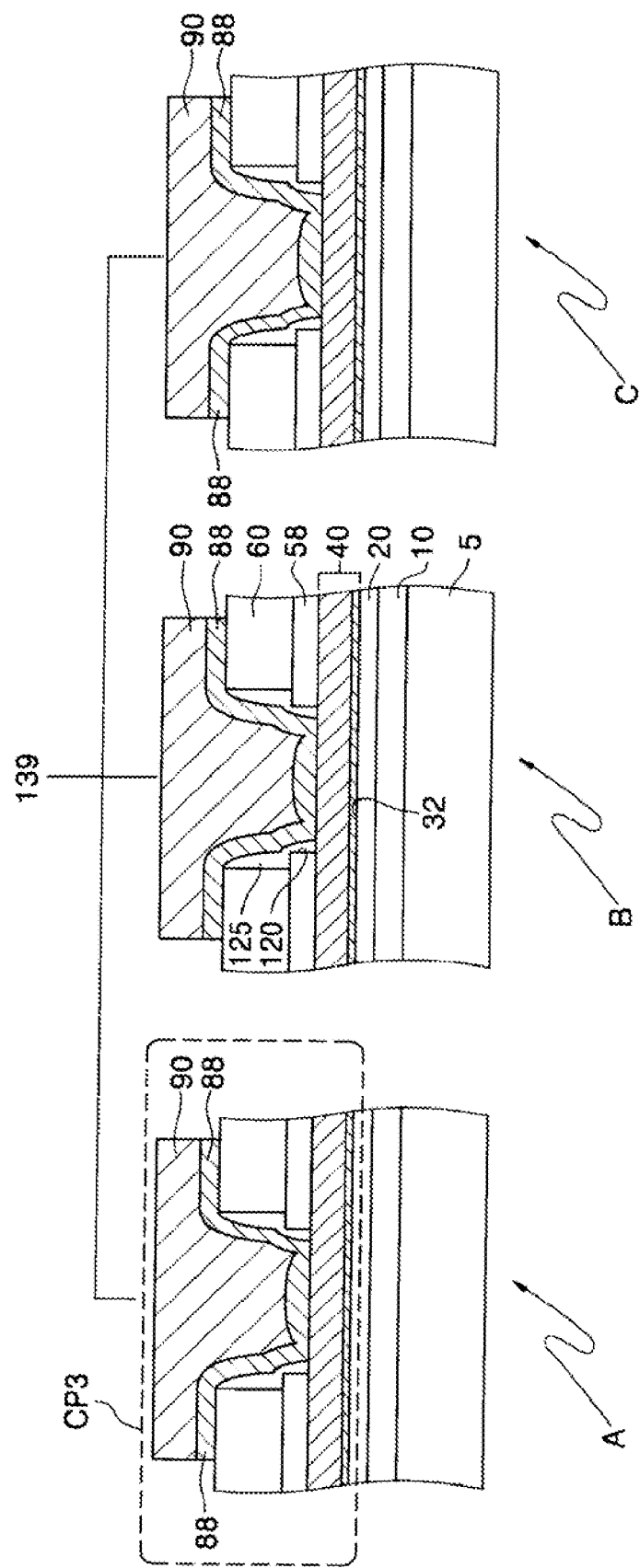
Figure 20:
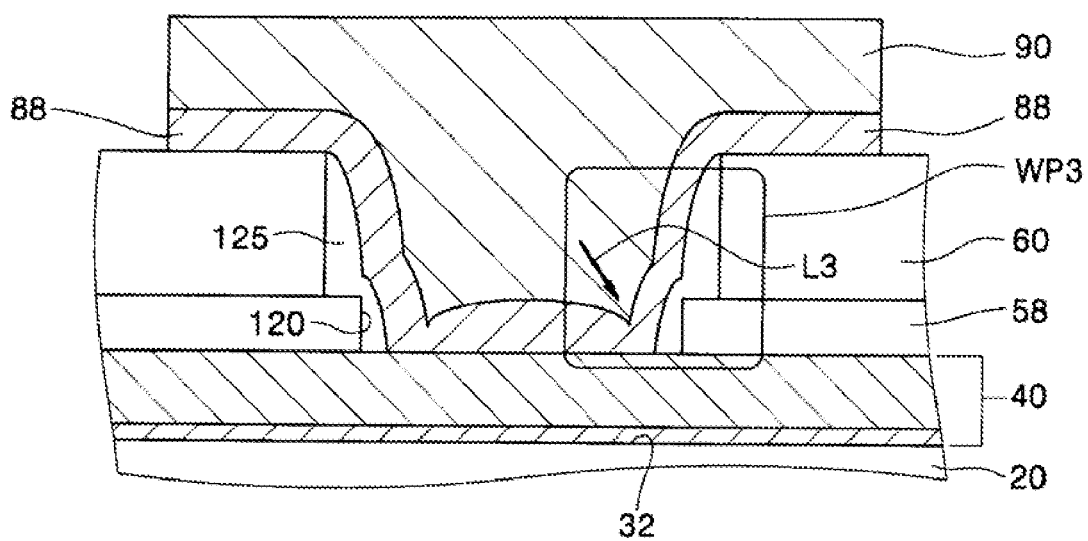

Referring to FIGS. 2, 19 and 20, an aluminum layer is formed on the barrier layer 84. Photoresist patterns (not shown in the drawings) may be formed on the aluminum layer. Using the photoresist patterns as etching masks, the aluminum layer and the barrier layer 84 disposed in the specific regions A, B and C of the semiconductor substrate 5 of FIG. 1 are etched, and thus aluminum interconnections 90 and barrier patterns 88 are formed. The aluminum interconnections 90 may be formed to fill the third contact holes 120, respectively. After the formation of the barrier pattern 88 and the aluminum interconnection 90, the photoresist patterns are removed from the semiconductor substrate 5.

To describe positions of the barrier pattern 88, the aluminum interconnection 90 and the copper interconnection 40 in the third contact hole 120, a check point CP3 of FIG. 19 is shown in FIG. 20. The barrier pattern 88 is not opened in the third contact hole 120 of the edge A or C of the semiconductor substrate 5. The barrier pattern 88 shows an asymmetric shape on the left and right sidewalls of the third contact hole 120 and thus may have a weak point WP3 (see FIG. 20).

The barrier pattern 88 is formed not to expose the copper interconnection 40 and the second interconnection induction layer 58 at the weak point WP3 through the third contact hole 120. This can be enabled by using the contact spacer 125 in the third contact hole 120. Therefore, atoms of the copper interconnection 40 are covered by the barrier pattern 88 and thus cannot interact with atoms of the aluminum interconnection 90 along a flow line L3. Likewise, in the region D or E of FIG. 1 other than the specific regions A, B and C of the semiconductor substrate 5, interaction between atoms of the aluminum interconnection 90 and the copper interconnection 40 can be substantially prevented by the barrier pattern 88.

The barrier pattern 88 can substantially prevent interaction between atoms of the aluminum interconnection 90 and the copper interconnection 40 in the third contact hole 120 on the entire surface of the semiconductor substrate 5. Consequently, the semiconductor device 139 according to an exemplary embodiment of the present invention can be embodied, using the third contact hole 120 electrically connecting the aluminum interconnection 90 with the copper interconnection 40 on the entire surface of the semiconductor substrate 5.

As described above, embodiments of the present invention provides structures electrically connecting aluminum and copper interconnections and methods of forming the structures. Using the structures electrically the connecting aluminum and copper interconnections, a current carrying capability of the aluminum and copper interconnections can be improved.

Exemplary embodiments of the present invention have been disclosed to herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the disclosure.

What is claimed is:

1. A method of fabricating a structure in a semiconductor device, comprising:
   forming a lower metal interconnection;
   forming a lower insulating layer defining a lower contact hole on the lower metal interconnection, the lower insulating layer exposing a portion of a surface of the lower metal interconnection;
   forming an upper insulating layer defining an upper contact hole wider than the lower contact hole on the lower metal interconnection, the upper insulating layer fully exposing the lower contact hole and a portion of a top surface of the lower insulating layer, the portion of the top surface of the lower insulating layer being around the lower contact hole, wherein a depth of the lower contact hole is shallower than a depth of the upper contact hole;
   forming a contact spacer disposed on sidewalls of the lower contact hole and the upper contact hole, wherein the contact spacer exposes a portion of the lower metal interconnection and covers an entire surface of the portion of the top surface of the lower insulating layer exposed by the upper insulating layer to smooth an inner shape formed by a step difference of the lower contact hole and the upper contact hole;
   forming a barrier pattern on the exposed surface of the lower metal interconnection, the contact spacer and a portion of a top surface of the upper insulating layer;
   forming a lower contact directly on the barrier pattern, wherein the lower contact fills the lower contact hole;
   forming an upper contact directly on the barrier pattern, wherein the upper contact fills the upper contact hole; and
   forming an upper metal interconnection directly on the upper contact and the barrier pattern on the portion of the top surface of the upper insulating layer.

2. The method according to claim 1, wherein the barrier pattern has a first thickness on the sidewalls of the lower insulating layer and a second thickness on the exposed portion of the surface of the lower metal interconnection, the second thickness being thicker than the first thickness.

3. The method according to claim 1, wherein the barrier pattern has a third thickness on the sidewalls of the upper insulating layer and a fourth thickness on the portion of the top surface of the upper insulating layer, the fourth thickness being thicker than the third thickness.

4. The method according to claim 1, further comprising:
   forming a middle insulating layer defining a middle contact hole on the lower insulating layer.

5. The method according to claim 4, wherein the middle insulating layer exposes a portion of a surface of the lower insulating layer and the upper insulating layer exposes a portion of a surface of the middle insulating layer.

6. The method according to claim 4, wherein the lower insulating layer includes a silicon-rich silicon nitride layer and the middle insulating layer includes a nitrogen-rich silicon nitride layer.

7. The method according to claim 4, wherein the middle contact hole is wider than the lower contact hole and narrower than the upper contact hole.

8. The method according to claim 1, wherein the lower insulating layer includes a silicon nitride layer.

9. The method according to claim 1, wherein a maximum thickness of the barrier pattern on the exposed surface of the lower metal interconnection is greater than the depth of the lower contact hole.

10. The method according to claim 9, wherein the barrier pattern fully fills the lower contact hole.

11. A method of fabricating a structure on a semiconductor device, comprising:
   forming a lower metal interconnection, forming a lower insulating layer on the lower metal interconnection, forming an upper insulating layer on the lower insulating layer;
   forming a photoresist pattern having an opening overlapping the lower metal interconnection;
   forming an upper contact hole and a lower contact hole by patterning the upper insulating layer and the lower insulating layer using the photoresist pattern as a patterning mask, wherein the upper contact hole is defined by the upper insulating layer and the lower contact hole is defined by the lower insulating layer;
   partially removing a portion of the upper insulating layer in the upper contact hole so that the upper contact hole has a larger width and a deeper depth than that of the lower contact hole;
   removing the photoresist pattern;
   forming a contact spacer disposed on sidewalls of the lower and upper contact holes and an entire surface of the lower insulating layer exposed by the upper contact hole to smooth an inner shape formed by a step difference of the lower contact hole and the upper contact hole, wherein the contact spacer exposes a portion of the lower metal interconnection;

forming a barrier pattern on the exposed surface of the lower metal interconnection, the contact spacer and a portion of a top surface of the upper insulating layer;

forming a lower contact directly on the barrier pattern, wherein the lower contact fills the lower contact hole;

forming an upper contact directly on the barrier pattern, wherein the upper contact fills the upper contact hole; and forming an upper metal interconnection directly on the barrier pattern on the portion of the top surface of the upper insulating layer.

12. The method according to claim 11, wherein partially removing the portion of the upper insulating layer in the upper contact hole is performed by isotropic etching.

13. The method according to claim 12, wherein the upper insulating layer has a different etch rate than the lower insulating layer during the isotropic etching.

14. The method according to claim 11, further comprising:
forming a middle insulating layer between the lower insulating layer and the upper insulating layer.

15. The method according to claim 14, further comprising forming a middle contact hole by patterning the middle insulating layer using the photoresist pattern as the patterning mask.

16. The method according to claim 15, wherein the middle contact hole is wider than the lower contact hole and narrower than the upper contact hole.

17. The method according to claim 15, wherein the lower insulating layer includes a silicon-rich silicon nitride layer and the middle insulating layer includes a nitrogen-rich silicon nitride layer.

18. The method according to claim 11, further comprising patterning both of the upper metal interconnection and the barrier pattern to leave both of the upper metal interconnection and the barrier pattern on the top surface on the upper insulating layer.

19. A method of fabricating a structure on a semiconductor device, comprising:

forming a copper interconnection;

forming a lower insulating layer defining a lower contact hole exposing a portion of the copper interconnection, the lower insulating layer exposing a portion of a surface the copper interconnection;

forming an upper insulating layer defining an upper contact hole wider than the lower contact hole on the copper interconnection, the upper insulating layer fully exposing the lower contact hole and a portion of a top surface of the lower insulating layer, the portion of the top surface of the lower insulating layer being around the lower contact hole;

forming a barrier layer on the exposed portion of the copper interconnection, sidewalls of the lower and upper contact holes, and a top surface of the upper insulating layer, wherein the barrier layer has a first thickness on the exposed portion of the copper interconnection and a second thickness on the sidewall of the upper insulating layer, the first thickness being thicker than the second thickness, and wherein the barrier layer fills the lower contact hole;

forming an aluminum layer filing the lower and upper contact holes on the exposed portion of the copper interconnection and the top surface of the upper insulating layer, wherein the aluminum layer has a first portion in the lower and upper contact holes, a second portion on the first portion and the top surface of the upper insulating layer, wherein the aluminum layer is directly formed on a barrier pattern; and selectively removing and leaving the aluminum layer and the barrier layer on the top surface of the upper insulating layer to form an aluminum interconnection and the barrier pattern, wherein sidewalls of the aluminum interconnection and the barrier pattern are vertically aligned with each other on the top surface of the upper insulating layer.

20. The method according to claim 19, wherein selectively removing and leaving the aluminum layer and the barrier layer comprise a dry etching process.

* * * * *